(12) United States Patent
Lee et al.

(10) Patent No.: US 10,079,305 B2
(45) Date of Patent: Sep. 18, 2018

(54) SEMICONDUCTOR DEVICE AND METHOD OF FABRICATING THE SAME

(71) Applicant: Samsung Electronics Co., Ltd., Suwon-si (KR)

(72) Inventors: Byeongchan Lee, Yongin-si (KR); Nam-Kyu Kim, Yongin-si (KR); JinBum Kim, Seoul (KR); Kwan Heum Lee, Suwon-si (KR); Choeun Lee, Pocheon-si (KR); Sujin Jung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 129 days.

(21) Appl. No.: 14/861,748

(22) Filed: Sep. 22, 2015

(65) Prior Publication Data

US 2016/0087104 A1  Mar. 24, 2016

(30) Foreign Application Priority Data

Sep. 23, 2014  (KR) ........................ 10-2014-0126727

(51) Int. Cl.

| | |
|---|---|
| *H01L 29/06* | (2006.01) |
| *H01L 29/165* | (2006.01) |
| *H01L 29/78* | (2006.01) |
| *H01L 21/02* | (2006.01) |
| *H01L 21/76* | (2006.01) |
| *H01L 29/08* | (2006.01) |
| *H01L 29/66* | (2006.01) |

(52) U.S. Cl.
CPC ...... *H01L 29/7851* (2013.01); *H01L 29/0649* (2013.01); *H01L 29/0688* (2013.01); *H01L 29/0847* (2013.01); *H01L 29/165* (2013.01); *H01L 29/66545* (2013.01); *H01L 29/66636* (2013.01); *H01L 29/66795* (2013.01); *H01L 29/7848* (2013.01)

(58) Field of Classification Search
CPC .................................................. H01L 29/0688
USPC ........................................................ 257/192
See application file for complete search history.

(56) References Cited

U.S. PATENT DOCUMENTS

| | | | |
|---|---|---|---|
| 7,368,357 B2 | 5/2008 | Lee | |
| 7,750,338 B2 | 7/2010 | Wang | |
| 7,864,592 B2 | 1/2011 | Murthy et al. | |
| 8,168,501 B2 | 5/2012 | Yu et al. | |

(Continued)

FOREIGN PATENT DOCUMENTS

| | | |
|---|---|---|
| KR | 10-1085884 B1 | 11/2011 |
| KR | 10-2013-0088188 A | 8/2013 |

*Primary Examiner* — Moazzam Hossain
*Assistant Examiner* — Omar Mojaddedi
(74) *Attorney, Agent, or Firm* — Muir Patent Law, PLLC

(57) ABSTRACT

Provided are a semiconductor device and a method of fabricating the same. The device may include an active pattern protruding from a substrate, gate structures crossing the active pattern, and a source/drain region provided between adjacent ones of the gate structures. The source/drain region may include a source/drain epitaxial layer in a recessed region, which is formed in the active pattern between the adjacent ones of the gate structures. Further, an impurity diffusion region may be provided in the active pattern to enclose the source/drain epitaxial layer along inner surfaces of the recessed region.

16 Claims, 22 Drawing Sheets

(56) References Cited

U.S. PATENT DOCUMENTS

| | | |
|---|---|---|
| 8,450,165 B2 | 5/2013 | Bohr |
| 2012/0100686 A1* | 4/2012 | Lu .................... H01L 21/26586 |
| | | 438/303 |
| 2012/0171864 A1* | 7/2012 | Akiyama .......... H01L 21/28518 |
| | | 438/675 |
| 2013/0207166 A1 | 8/2013 | Chen et al. |
| 2013/0228862 A1 | 9/2013 | Lee et al. |
| 2013/0248948 A1 | 9/2013 | Ma et al. |
| 2014/0077229 A1* | 3/2014 | Liu ................... H01L 29/66795 |
| | | 257/77 |
| 2015/0048417 A1* | 2/2015 | Kwok ................ H01L 29/7848 |
| | | 257/190 |

\* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2014-0126727, filed on Sep. 23, 2014, in the Korean Intellectual Property Office, the entire contents of which are hereby incorporated by reference.

BACKGROUND OF THE INVENTION

Example embodiments of the inventive concept relate to a semiconductor device and a method of fabricating the same, and in particular, to a fin field effect transistor and a method of fabricating the same.

A semiconductor device may include integrated circuits (ICs) having metal-oxide-semiconductor field-effect transistors (MOS-FETs). As reduction in size and design rule of the semiconductor device is accelerated, the MOS-FETs continue to be scaled down. The reduction in size of the MOS-FET may lead to deterioration in operational properties of the semiconductor device. A variety of studies have been and continue to be conducted to overcome technical limitations associated with the scale-down of the semiconductor device and provide high performance semiconductor devices.

SUMMARY

Example embodiments provide a semiconductor device with improved electric characteristics and a method of fabricating the same.

A semiconductor device may comprise an active pattern protruding from a substrate, the active pattern comprising a recess having a bottom surface and side surfaces that face each other and having a curved profile in a cross sectional view taken in a first direction parallel to a length direction of the active pattern; first and second gate structures crossing the active pattern, each of the first and second gate structures comprising a gate electrode, the first gate structure being adjacent to the second gate structure with the recess of the active pattern positioned between the first gate structure and the second gate structure; and a source/drain region provided between the first and second gate structures.

The source/drain region may comprise a source/drain epitaxial layer formed in the recess; and an impurity diffusion region formed in the active pattern surrounding the source/drain epitaxial layer along the bottom and side surfaces.

The source/drain epitaxial layer may comprise a first epitaxial layer in contact with the bottom and side surfaces of the recess, a second epitaxial layer on the first epitaxial layer, and a third epitaxial layer on the second epitaxial layer.

The first to third epitaxial layers and the impurity diffusion region may be doped with the same impurities.

The third epitaxial layer may have an impurity concentration that is higher than that of the first epitaxial layer and lower than that of the second epitaxial layer.

The impurity diffusion region may comprise an overlap region directly under the first gate electrode.

The active pattern may comprise first and second active fins respectively positioned below the first and second gate structures. The side surfaces of the recess may be defined by sidewalls of the first and second active fins.

The overlap region of the impurity diffusion region may have a vertical length that is equal to or larger than a vertical distance from the bottom surface of the recess to a top surface of the active fin.

A boundary of the impurity diffusion region in the first active fin in the overlap region may have a radius of curvature greater than a radius of curvature of a side surface of the recess adjacent to the boundary.

Each of the side surfaces of the recess may comprise a first side surface and a second side surface. A width of the recess between the first side surfaces may increase in a downward direction. A width of the recess between the second side surfaces may decrease in the downward direction.

A top surface of each the active fins may be lower than an uppermost portion of the third epitaxial layer and is higher than a lowermost portion of an interface between the second and third epitaxial layers.

A thickness of a lowermost portion of the second epitaxial layer on the bottom surface may be greater than a thickness of a lowermost portion of the first epitaxial layer.

Each of the gate structures may comprise gate spacers on both sidewalls of the gate electrode; and a gate dielectric pattern between the active pattern and the gate electrode, The gate electrode may extend parallel to a second direction crossing the active pattern.

The source/drain epitaxial layer may comprise a first portion in contact with the active pattern, a second portion extending from the first portion, and a third portion extending from the second portion.

In a cross sectional view taken parallel to the first direction, a width of the second portion in the second direction may increase in an upward direction and a width of the third portion in the second direction may decrease in an upward direction, and a width of the source/drain epitaxial layer in the second direction may be largest at an interface between the second and third portions.

The semiconductor device may comprise first and second device isolation patterns provided on the substrate respectively at opposite sides of the active pattern; and sidewall spacers provided on the device isolation patterns, The sidewall spacers may extend along sidewalls of the first portion but may not extend to be adjacent to the second and third portions.

Each of the first to third epitaxial layers may contain germanium, and germanium concentrations of the second and third epitaxial layers may be higher than that of the first epitaxial layer.

The source/drain epitaxial layer may further comprises a fourth epitaxial layer on the third epitaxial layer, and the fourth epitaxial layer comprises a silicon layer.

As viewed from a cross section taken perpendicular to the second direction, an outer boundary of the impurity diffusion region may have a "U" shape.

The impurity concentration of the second epitaxial layer may be at least 100 times greater than the impurity concentration of the first epitaxial layer.

The impurity concentration of the third epitaxial layer may be at least 10 times greater than the impurity concentration of the first epitaxial layer.

A bottom surface of the recess may be at a height substantially equal to the height of top surfaces of the device isolation patterns.

The first, second and third epitaxial layers may each comprise a compound semiconductor material comprised of a first semiconductor element and a second semiconductor element and are each doped with a charge carrier impurity.

The atomic percentage of the second semiconductor material in the first epitaxial layer may be less than the atomic percentage of the second semiconductor material in the second epitaxial layer and less than the atomic percentage of the second semiconductor material in the third epitaxial layer.

A concentration of a charge carrier impurity in the second epitaxial layer may be higher than a concentration of the charge carrier impurity in the third epitaxial layer.

The active pattern may comprise the first semiconductor material.

The first and second semiconductor materials may be group IV type semiconductor materials.

A method of fabricating a semiconductor device may comprise forming a protruding active pattern with a substrate; forming a sacrificial gate pattern on the substrate to cross the active pattern; forming a recessed region in the active pattern at a side of the sacrificial gate pattern; forming a source/drain epitaxial layer to fill the recessed region; forming an impurity diffusion region in the active pattern; and replacing the sacrificial gate pattern with a gate electrode, wherein the forming of the source/drain epitaxial layer comprises: performing a first selective epitaxial process, in which the active pattern exposed by the recessed region is used as a seed layer, to form a first epitaxial layer; performing a second selective epitaxial process, in which the first epitaxial layer is used as a seed layer, to form a second epitaxial layer; and performing a third selective epitaxial process, in which the second epitaxial layer is used as a seed layer, to form a third epitaxial layer, and the first to third epitaxial layers are doped with impurities in such a way that the third epitaxial layer has an impurity concentration that is lower than that of the second epitaxial layer and is higher than that of the first epitaxial layer.

The first to third epitaxial layers may be in-situ doped with the impurities, and the impurity diffusion region may be formed through thermal diffusion of the impurities from the first to third epitaxial layers into the active pattern.

Forming of the source/drain epitaxial layer may comprise performing a fourth selective epitaxial growth process, in which the third epitaxial layer is used as a seed layer, to form a fourth epitaxial layer, The first selective epitaxial process may be performed under a pressure higher than that in the second selective epitaxial growth process and third selective epitaxial growth process, wherein the first selective epitaxial growth process is performed under a pressure ranging from 50 Torr to 300 Torr, and wherein the first epitaxial layer is conformally formed on an inner surface of the recessed region.

Forming a recessed region in the active pattern at a side of the sacrificial gate pattern comprises performing an isotropic etch of the active pattern followed by performing an anisotropic etch of the active pattern.

In example embodiments, the semiconductor device of claim may include a junction between the impurity diffusion region, active fin, and active pattern, where the junction includes a sidewall profile of the vertically oriented active fin and an interface of an upper surface of the active pattern with a lower surface of the impurity diffusion region.

In example embodiments, the first to third epitaxial layers of the semiconductor device may be doped with boron as impurities, where each may have a different concentration and be within a range of $1\times10^{18}$ atom/cm$^3$ to $5\times10^{21}$ atom/cm$^3$. The impurity diffusion region may also be doped with boron, having a concentration in a range of $1\times10^{17}$ to $1\times10^{19}$ atom/cm$^3$ and continuously decreasing in a direction away from the source/drain epitaxial layer. The impurity diffusion region may also be formed such that it creates an overlap region where the impurity diffusion region overlaps with at least corresponding ones of the gate dielectric pattern, when viewed in a plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
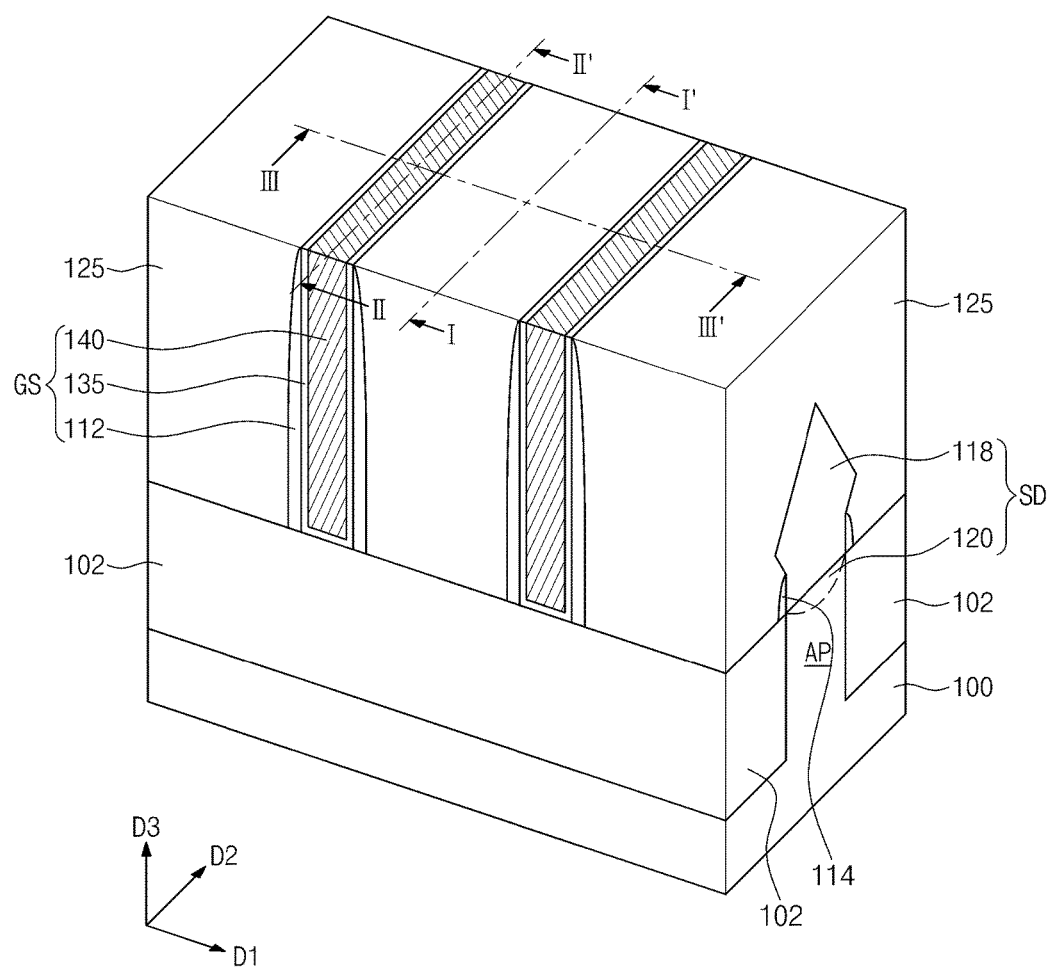
FIG. 1A is a perspective view illustrating a semiconductor device according to example embodiments.

It should be noted that these figures are intended to illustrate the general characteristics of methods, structure and/or materials utilized in certain example embodiments and to supplement the written description provided below. These drawings may not be to scale and may not precisely reflect the precise structural or performance characteristics of any given embodiment, and should not be interpreted as defining or limiting the range of values or properties encompassed by example embodiments.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could be termed a "second" element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both a real world orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the field of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
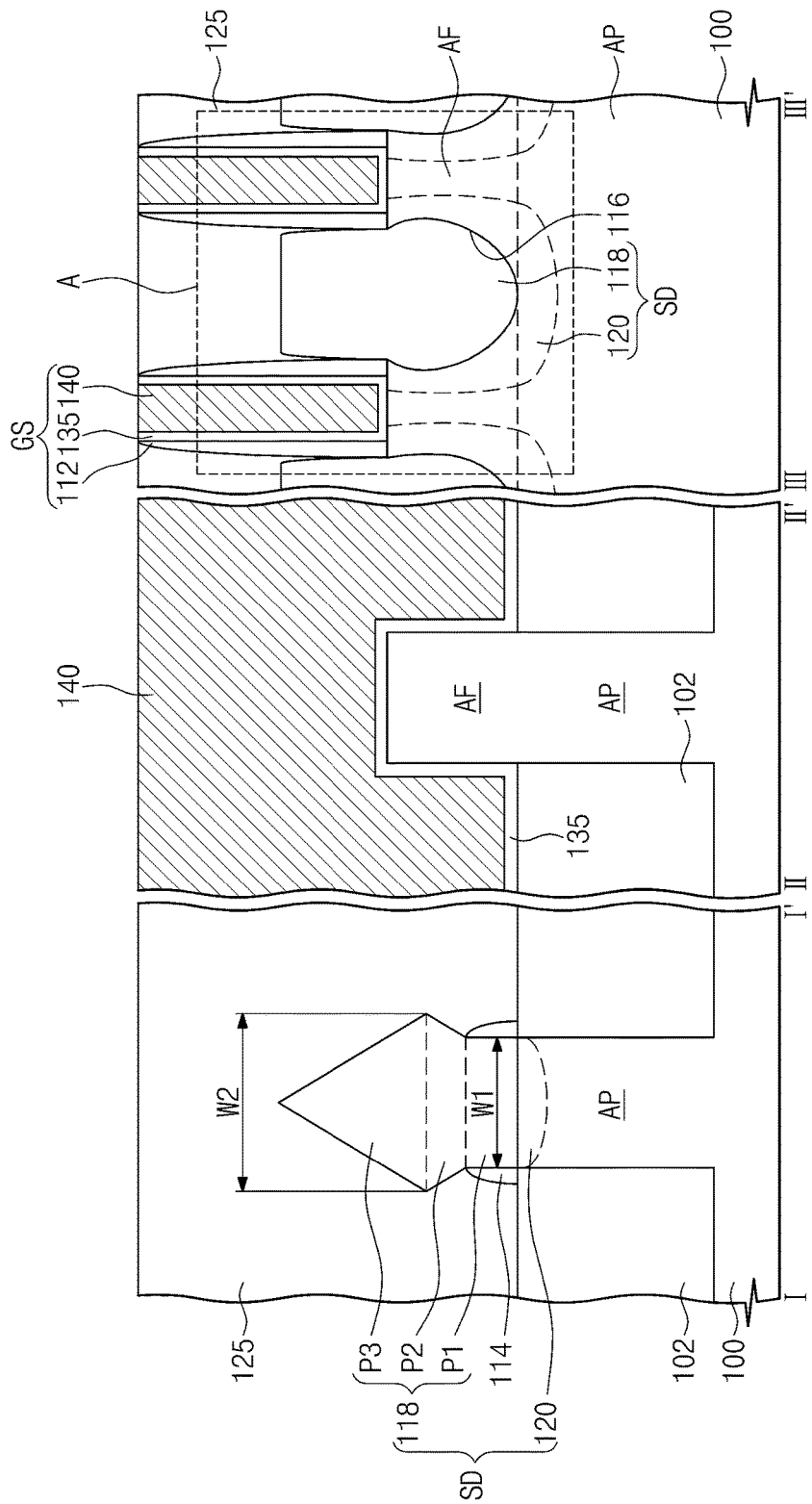
FIG. 1B is a sectional view illustrating vertical sections taken along lines I-I', II-II', and III-III' of FIG. 1A.
Figure 2:
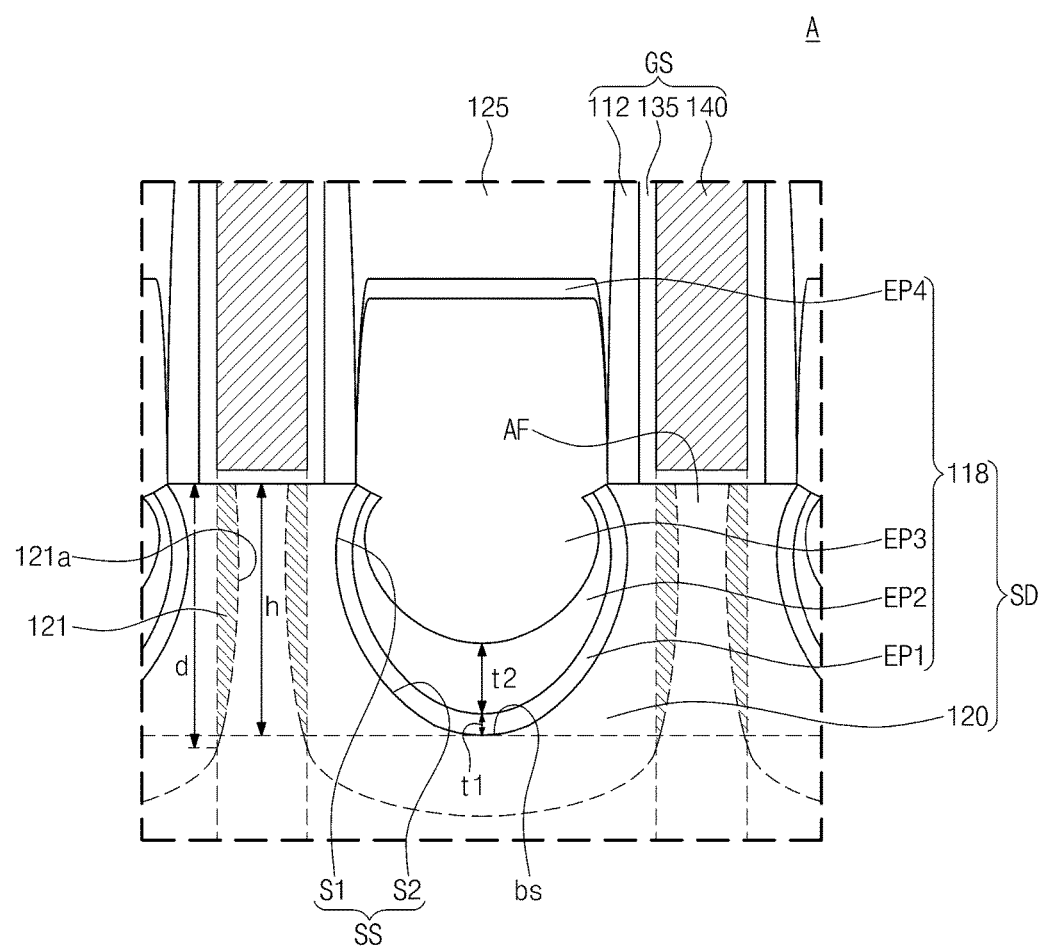
FIG. 2 is an enlarged view of portion A of FIG. 1B.

FIG. 1A is a perspective view illustrating a semiconductor device according to example embodiments, and FIG. 1B is a sectional view illustrating vertical sections taken along lines I-I', II-II', and III-III' of FIG. 1A. FIG. 2 is an enlarged view of a portion A of FIG. 1B.

Referring to FIGS. 1A, 1B, and 2, a substrate 100 with an active pattern AP may be provided. The substrate 100 may be a semiconductor substrate. For example, the substrate 100 may be a bulk silicon wafer or a silicon-on-insulator (SOI) wafer. The active pattern AP may extend along a first direction D1. For example, the active pattern AP may have a longitudinal axis parallel to the first direction D1 and a transversal axis parallel to a second direction D2, which is not parallel to the first direction D1. The active pattern AP may protrude from the substrate 100 in an upward or third direction D3, which may be perpendicular to the first and second directions D1 and D2. The active pattern AP may be a portion of the substrate 100 or an epitaxial pattern epitaxially grown from the substrate 100. The active pattern AP may be doped to have a first conductivity type. Although only one active pattern AP is illustrated in the drawings, example embodiments may not be limited thereto.

Device isolation patterns 102 may be provided at both sides of the active pattern AP. The device isolation patterns 102 may include, for example, at least one of oxide, nitride, or oxynitride. The device isolation patterns 102 may cover a portion of a sidewall of the active pattern AP. For example, the device isolation patterns 102 may be formed to cover a lower sidewall of the active pattern AP and allow an upper sidewall of the active pattern AP to be exposed with respect to the device isolation patterns 102. The upper portion of the active pattern AP extending above the bottom surface bs of a recessed region 116 (and is referred to herein) as an active fin AF, and may be an active fin AF of a transistor. It should be noted that portions of the active pattern AP below the bottom surface bs of the recessed region 116 (e.g., portions of the active pattern AP that are not part of an active fin AF) may also have a fin shape and be contiguous with the active fin AF. As will be described below, the active fin AF may be a portion of the active pattern AP, which may be locally positioned below a gate structure GS. The active fin AF may include a portion of the active pattern AP, which protrudes above the device isolation patterns 102.

The gate structure GS may be formed on the substrate 100 to cross the active pattern AP. The gate structure GS may extend in a direction parallel to the second direction D2 and crossing the active pattern AP and cover top and side surfaces of the active fin AF. The gate structure GS may include a gate electrode 140 crossing the active pattern AP, a gate spacer 112 on both sidewalls of the gate electrode 140, and a gate dielectric pattern 135 between the gate electrode 140 and the gate spacer 112. The gate dielectric pattern 135 may also include a portion provided between the gate electrode 140 and the active fin AF and other portions extending horizontally from the active fin AF and partially covering a top surface of each of the device isolation patterns 102. A portion of the gate dielectric pattern 135 may extend along a bottom surface of the gate electrode 140.

The gate electrode 140 may include, for example, at least one of conductive metal nitrides (e.g., titanium nitride, tantalum nitride, and so forth) or metals (e.g., aluminum, tungsten, and so forth). The gate spacer 112 may include, for example, a nitride (e.g., silicon nitride). The gate dielectric pattern 135 may include at least one of high-k dielectrics. For example, the gate dielectric pattern 135 may include at least one of hafnium oxide, hafnium silicate, zirconium oxide, and zirconium silicate, but example embodiments should not be considered limited to these materials.

In example embodiments, the semiconductor device may include a plurality of gate structures GS, and some of the gate structures GS may be provided to cross at least one of the active patterns AP. For example, a pair of the gate structures GS may be spaced apart from each other in the first direction D1 and cross one of the active patterns AP in the second direction D2.

Recessed regions 116 may be formed in the active pattern AP that are positioned at both sides of the gate structure GS (see FIGS. 1B and 2). For example, the recessed regions 116 may be formed between the gate structures GS or between the portions of the active fins AF directly below the gate structures GS. As an example, the recessed region 116 between adjacent ones of the gate structures GS may have side surfaces SS defined by opposite sidewalls of adjacent ones of the active fins AF. Recessed region 116 shown in FIG. 2 shows two side surfaces SS. The side surfaces SS of the recessed regions 116 may be formed to have a curved surface. In example embodiments, each of the side surfaces SS of the recessed regions 116 may include a first side surface S1 and a second side surface S2. The first and second side surfaces S1 and S2 may include a (111) plane. A width of the recessed region 116 may increase in a downward direction between the first side surfaces S1 and in an upward direction between the second side surfaces S2. Further, each of the recessed regions 116 may have a bottom surface bs that includes a (100) plane. The bottom surface bs may connect opposing side surfaces SS of the recessed region 116. A portion (hereinafter, "undercut region") of the recessed region 116, where the first and second side surfaces S1 and S2 meet each other, may have a laterally-curved or tapered shape that protrudes in toward the active fin AF. The undercut region may be positioned below the gate spacer 112. The undercut region may not be positioned directly below the gate electrodes (e.g., when viewed in a plan view, the undercut region may not be overlap with the gate electrode 140. Due to the curved or tapered shape of the recessed regions 116, the sidewalls of the active fins AF may have a concave vertical cross sectional shape (see FIG. 2, e.g.). The recessed region 116 may have a shape that grows in width as it curves downward from its upper position, starting from a height substantially equivalent to the top surface of the active fin AF. The shape may curve outward until reaching a maximum width at locations positioned below respective gate spacers 112, before curving inward in a concave fashion with reducing width until reaching the bottom surface bs. The curves on both sides of the recessed region may mirror each other.

A source/drain epitaxial layer 118 may be provided in each of the recessed regions 116. The source/drain epitaxial layer 118 may be in contact with the side and bottom surfaces SS and bs of the recessed region 116. The source/drain epitaxial layer 118 may have a shape defined by and corresponding to that of the recessed region 116. As an example, a sidewall of the source/drain epitaxial layer 118 in contact with the active fin AF may have a convex shape. For example, an upper portion of the source/drain epitaxial layer 118, which is defined by the first side surfaces S1 of the recessed region 116, may have a downwardly increasing width, and a lower portion of the source/drain epitaxial layer 118, which is defined by the second side surfaces S2 of the recessed region 116, may have a downwardly decreasing width.

The source/drain epitaxial layer 118 may include a plurality of epitaxial layers. In example embodiments, the source/drain epitaxial layer 118 may include first to third epitaxial layers EP1, EP2, and EP3, which are sequentially stacked in the recessed region 116 (see FIG. 2, e.g.). At least one of the first to third epitaxial layers EP1, EP2, and EP3 may include a semiconductor material, whose lattice constant is different from that of the substrate 100, and which has a second conductivity type different from the first conductivity type. For example, all of the first to third epitaxial layers EP1, EP2, and EP3 may include a semiconductor material whose lattice constant is different from (e.g., larger) that of the substrate 100 and which has a second conductivity type different from the first conductivity type.

For example, the first epitaxial layer EP1 may be used as a buffer layer in contact with the active fin AF at sidewalls of the recessed region 118 within the active fin AF. The first epitaxial layer EP1 may extend up to a top surface of the active fin AF and may be an epitaxial semiconductor layer with a relatively low concentration of a semiconductor material having a lattice constant greater than the lattice constant of the semiconductor material of the active fin AF. As an example embodiment, the first epitaxial layer EP1 may be formed of or include a silicon-germanium layer and the active fin AF may comprise silicon. According to an example embodiment, the first epitaxial layer EP1 may have a germanium concentration less than 30 at % (atomic percent). In example embodiments, the first epitaxial layer EP1 may be formed to conformally cover the surfaces of the recessed region 116. Further, the first epitaxial layer EP1 may have a first thickness t1, when measured from the bottom surface bs of the recessed region 116 in a vertical direction.

The second and third epitaxial layers EP2 and EP3 may be used as a bulk layer for exerting a stress on the active fin AF and may comprise an epitaxial semiconductor layer with a relatively high concentration of a semiconductor material having a lattice constant greater than the lattice constant of the semiconductor material of the active fin AF. As an example, each of the second and third epitaxial layers EP2 and EP3 may be formed of or include a silicon-germanium layer. According to an example embodiment, the second and third epitaxial layers EP2 and EP3 may have germanium concentrations higher than that of the first epitaxial layer EP1. For example, each of the second and third epitaxial layers EP2 and EP3 may have a germanium concentration ranging from 30 at % to 70 at %. The remainder of the intrinsic type semiconductor material of the first, second and third epitaxial layers EP1, EP2 and EP3 may be another group IV type semiconductor material and be the same semiconductor material that forms the active fin AF, such as silicon to form a compound group IV semiconductor material (e.g., SiGe). One or more of the first, second and third epitaxial layers EP1, EP2 and EP3 may also include charge carrier impurities. Doping concentrations of charge carrier impurities of the second and third epitaxial layers EP2 and EP3 may be higher than that of the first epitaxial layer EP1. Further, the doping concentration of charge carrier impurities of the second epitaxial layer EP2 may be higher than that of the third epitaxial layer EP3. As an example, in the case where the first to third epitaxial layers EP1-EP3 are doped with boron, a boron concentration of the second epitaxial layer EP2 may range from $1 \times 10^{21}$ to $5 \times 10^{21}$ atom/cm$^3$ and a boron concentration of the first epitaxial layer EP1 may range from $1 \times 10^{18}$ to $1 \times 10^{19}$ atom/cm$^3$. According to an example embodiment, the boron concentration of the third epitaxial layer EP3 may be equal to or higher than $1 \times 10^{20}$ atom/cm$^3$ and be lower than that of the second epitaxial layer EP2.

The second epitaxial layer EP2 may be thicker at locations adjacent the bottom surface bs (above the bottom surface bs) than at locations adjacent the side surfaces SS (e.g., at locations not above the bottom surface bs). The second epitaxial layer EP2 may have a second thickness t2, when measured from the bottom surface bs of the recessed region 116 in the vertical direction. The second thickness t2 may be larger than the first thickness t1 of the first epitaxial layer EP1 at the bottom surface bs. In example embodiments, the second epitaxial layer EP2 may have a convex shaped outer surface and a concave shaped inner surface. All or some of an interface between the second and third epitaxial layers EP2 and EP3 may be positioned at a lower level than the top surface of the active fin AF. The highest portion of the third epitaxial layer EP3 may be positioned at a higher level than the top surface of the active fin AF.

In example embodiments, the source/drain epitaxial layer 118 may further include a fourth epitaxial layer EP4 on the third epitaxial layer EP3. The fourth epitaxial layer EP4 may serve as a capping layer for protecting the third epitaxial layer EP3 thereunder and may be an epitaxial layer containing the same material as the substrate 100. As an example, the fourth epitaxial layer EP4 may be formed of or include a single crystalline silicon layer. Similar to the first epitaxial layer EP1, the fourth epitaxial layer EP4 may be lightly doped to have the second conductivity type.

The source/drain epitaxial layer 118 may be used as a part of a PMOS transistor. According to an example embodiment where the source/drain epitaxial layer 118 has a material (e.g., silicon germanium) having a lattice constant larger than that of the substrate 100, the source/drain epitaxial layer 118 may exert a compressive force to the active fin AF. This makes it possible to improve mobility of major carriers (i.e., electrons) in a channel region of the PMOS transistor. The channel region of a PMOS transistor may be formed in the active fin AF under gate structure 140 at locations between opposing source/drain regions SD. For example, the channel region may be formed at the top surface of the active fin AF and extend between two adjacent impurity regions 120.

In certain embodiments, sidewall spacers 114 may be provided on the device isolation patterns 102 and at both sides of the gate structure. The sidewall spacers 114 may be spaced apart from each other, in the second direction D2, with the active pattern AP interposed therebetween and may be in contact with lower portions of the source/drain epitaxial layers 118. Each of the sidewall spacers 114 may extend along the first direction D1 and be in contact with the gate spacer 112 of gate structure GS. In some examples, each of the sidewall spacers 114 may extend along a boundary between the source/drain epitaxial layers 118 and the device isolation pattern 102, which are positioned adjacent thereto, thereby being in contact with the gate spacer 112. The sidewall spacers 114 may include the same material as the gate spacer 112. For example, the sidewall spacers 114 may include silicon nitride or low-k nitrides (e.g., SiCN or SiOCN).

When viewed in a section taken along the second direction D2 (e.g., left side of FIG. 1B), the source/drain epitaxial layer 118 may include a first portion P1, which is covered with the sidewall spacers 114 and is in contact with the active pattern AP, a second portion P2, which has a substantially increasing width in a direction away from the substrate 100, and a third portion P3, which has a substantially decreasing width in the direction away from the substrate 100. The first portion P1 may have a first width W1, which may be substantially equal to a space between the sidewall spacers 114 separated from each other in the second direction D2. The source/drain epitaxial layer 118 may have a second width W2, which is the maximum width thereof, at an interface of the second and third portions P2 and P3. It should be noted that in the example shown in FIGS. 1A, 1B and 2, the bottom surface bs of the recessed region 116 is the same height as the top surface of the device isolation pattern 102—this may depend on an etching amount of the active pattern AP when forming the recessed region 116. However, the bottom surface bs of the recessed region 116 may be higher or lower than the top surface of the device isolation pattern 102. Thus, portions of the active pattern AP that are not part of an active fin AF may have a top surface higher or lower than or the same as the top surface of the device isolation pattern 102.

An impurity diffusion region 120 may be formed in the active pattern AP to surround the source/drain epitaxial layer 118 at an inner surface of the recessed region 116. In detail, the impurity diffusion region 120 may be provided in the active fins AF at both sides of the source/drain epitaxial layer 118 and in the active pattern AP under the source/drain epitaxial layer 118. The impurity diffusion region 120 may be formed through thermal diffusion of impurities from the source/drain epitaxial layer 118 into the active pattern AP. According to an example embodiment described above where the source/drain epitaxial layer 118 is doped with boron, the impurity diffusion region 120 may have a boron doping concentration from $1 \times 10^{17}$ to $1 \times 10^{19}$ atom/cm$^3$. The impurity diffusion region 120 may have a boron doping concentration continuously decreasing in a direction away from the source/drain epitaxial layer 118. The impurity diffusion region 120, formed in the active pattern AP may have a 'U'-Shaped Profile.

In example embodiments, the impurity diffusion region 120 may include an overlap region 121, which is a region that the gate electrode 140 overlaps in a plan view. A vertical length d of the overlap region 121 may be equal to or larger than a height h of the active fin AF. For example, the height h of the active fin AF may be defined as a vertical length from the bottom surface bs of the recessed region 116 to the top surface of the active fin AF. In addition, an interface 121a between the overlap region 121 and the active fin AF may be more flat than the side surface SS of the recessed region 116 adjacent thereto. In other words, the interface 121a between the overlap region 121 and the active fin AF may have a curvature radius greater than that of the side surface SS of the recessed region 116 adjacent to the interface 121a (e.g., with respect to the cross section shown in FIG. 2). The source/drain epitaxial layer 118 and the impurity diffusion region 120 may serve as a source/drain region SD of a three-dimensional field effect transistor (3D FET) according to example embodiments.

With reference to FIGS. 1A, 1B, 2, and the like, it will be understood that the drain region may be the source region and that the drain region may be the source region depending on the operation of the device and that each of the described source region and drain region thus may be considered a source/drain region SD.

A lower interlayer insulating layer 125 may be formed on the substrate 100 to cover the source/drain regions SD. The lower interlayer insulating layer 125 may have a top surface substantially coplanar with those of the gate structures GS. The lower interlayer insulating layer 125 may be, for example, formed of or include at least one of a silicon oxide layer, a silicon nitride layer, a silicon oxynitride layer, or low-k dielectric layers.

Although not shown, an upper interlayer insulating layer may be disposed on the structure illustrated in FIGS. 1A, 1B and 2. The upper interlayer insulating layer may include, for example, oxide, nitride, and/or oxynitride. Contact holes (not shown) may be formed to expose the source/drain regions SD through the upper interlayer insulating layer and the lower interlayer insulating layer 125. Contact plugs (not shown) may be disposed in the contact holes, respectively. In addition, interconnection lines (not shown) may be provided on the upper interlayer insulating layer and may be connected to the contact plugs. The interconnection lines may be electrically connected to the source/drain regions SD, respectively, via the contact plugs. Each of the contact plugs and the interconnection lines may include a conductive material.

According to example embodiments of a 3D FET, it is possible to utilize more surfaces of the active pattern AP as a channel region, compared with that of a two-dimensional FET. Not only a top surface but also side surfaces of the active fin AF can be used as the channel region for an example embodiment of a 3D FET. In addition, upper portions of the active pattern AP below the active fin AF (i.e., not part of the active fin AF) may act as a channel region due to the impurity diffusion region 120 extending into the active pattern AP below the active fin AF. In order to realize a semiconductor device with good electrical characteristics, it is necessary to improve uniformity in a sidewall profile of the active fin AF in a vertical direction. However, the scale down of the semiconductor device may lead to several difficulties in forming active fins with uniform sidewall profile. According to other example embodiments, by controlling a doping concentration of the source/drain epitaxial layer 118, it is possible to form the impurity diffusion region 120 with a substantially 'U'-shaped section. Accordingly, although the active fin AF in contact with the source/drain epitaxial layer 118 has a curved or concave sidewall, it is possible to electrically realize a 'U'-shaped junction profile. As a result, it is possible to improve electric characteristics of the semiconductor device.

FIGS. 3A through 7A and 9A are perspective views illustrating a method of fabricating a semiconductor device according to example embodiments, and FIGS. 3B through 7B and 9B are sectional views illustrating vertical sections taken along lines I-I', II-II', and III-III' of FIGS. 3A through 7A and 9A, respectively. FIG. 8 is an enlarged view of a portion B of FIG. 7B.

Figure 3A:
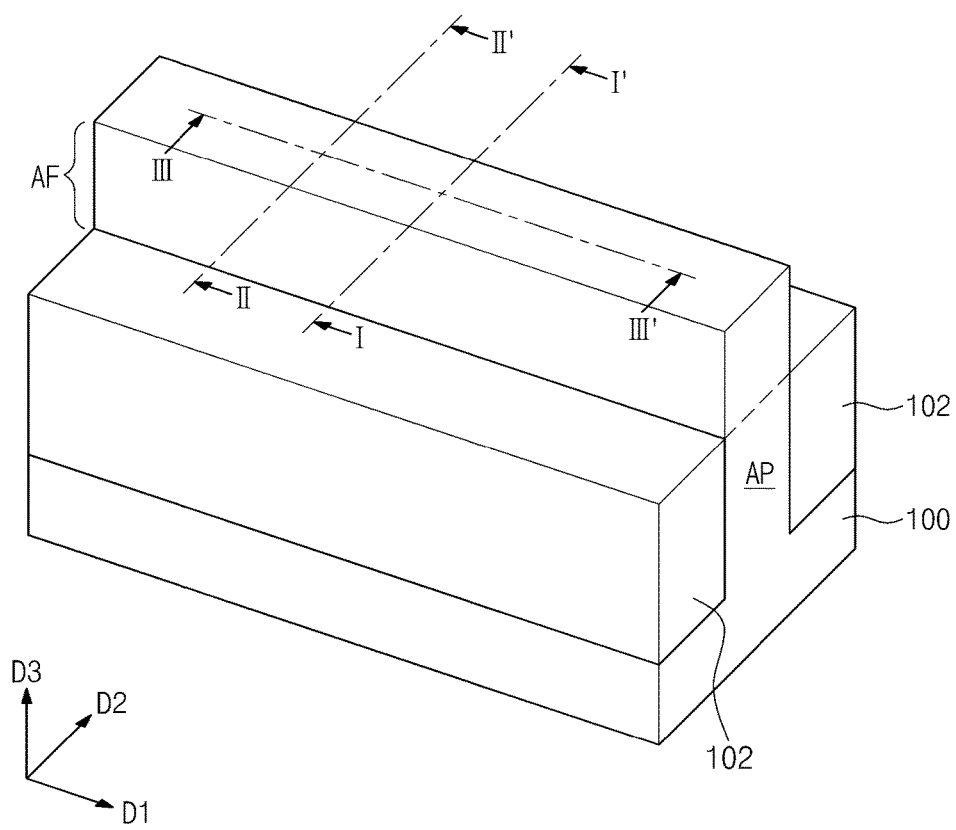
FIGS. 3A, 4A, 5A, 6A, 7A, and 9A are perspective views illustrating a method of fabricating a semiconductor device according to example embodiments.
Figure 3B:
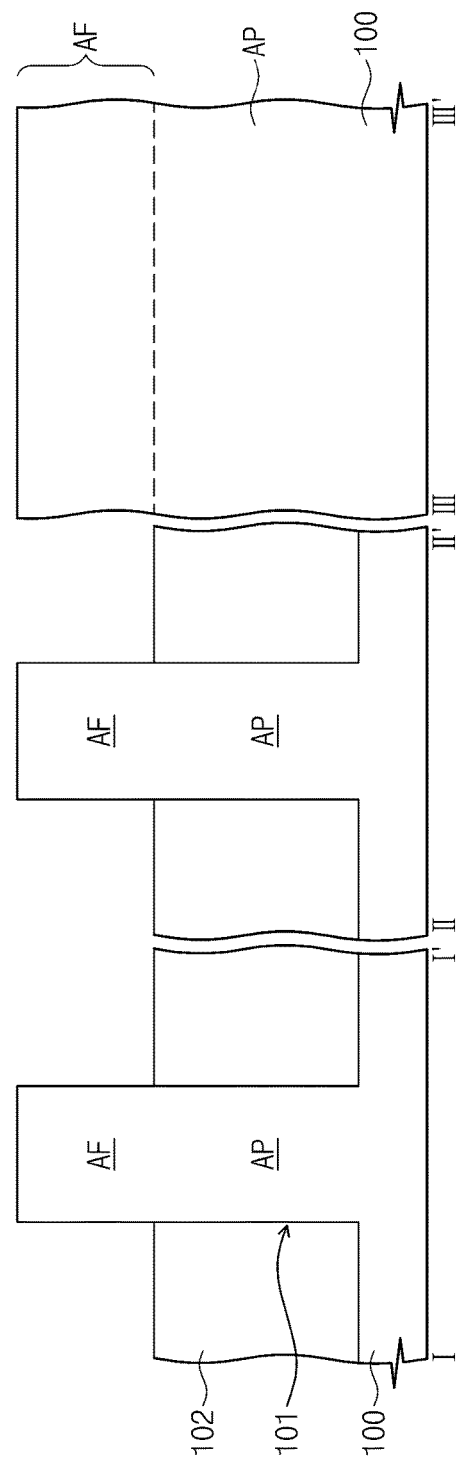
FIGS. 3B, 4B, 5B, 6B, 7B, and 9B are sectional views illustrating vertical sections taken along lines I-I', II-II', and III-III' of FIGS. 3A through 7A and 9A, respectively.

Referring to FIGS. 3A and 3B, the substrate 100 may be patterned to form the active pattern AP. For example, the formation of the active pattern AP may include forming a mask pattern (not shown) on the substrate 100 and anisotropically etching the substrate 100 using the mask pattern as an etch mask. As a result of the anisotropic etching of the substrate 100, trenches 101 may be formed on the substrate 100 to define the active pattern AP. The trenches 101 may be formed to extend parallel to the first direction D1 and may be spaced apart from each other in the second direction D2 crossing the first direction D1. In other words, the active pattern AP may be formed to have a shape extending parallel to the first direction D1. A plurality of active patterns AP may be formed spaced apart from each other in the second direction D2 and extend parallel to the first direction D1. In other examples, the plurality of active patterns AP may be formed by epitaxially growing active patterns from the surface of substrate 100 exposed by device isolation patterns. The substrate 100 may be a bulk silicon wafer or a SOI wafer, but the inventive concepts are not be limited thereto. The active pattern AP may be doped with impurities to have a first conductivity type.

Figure 4A:
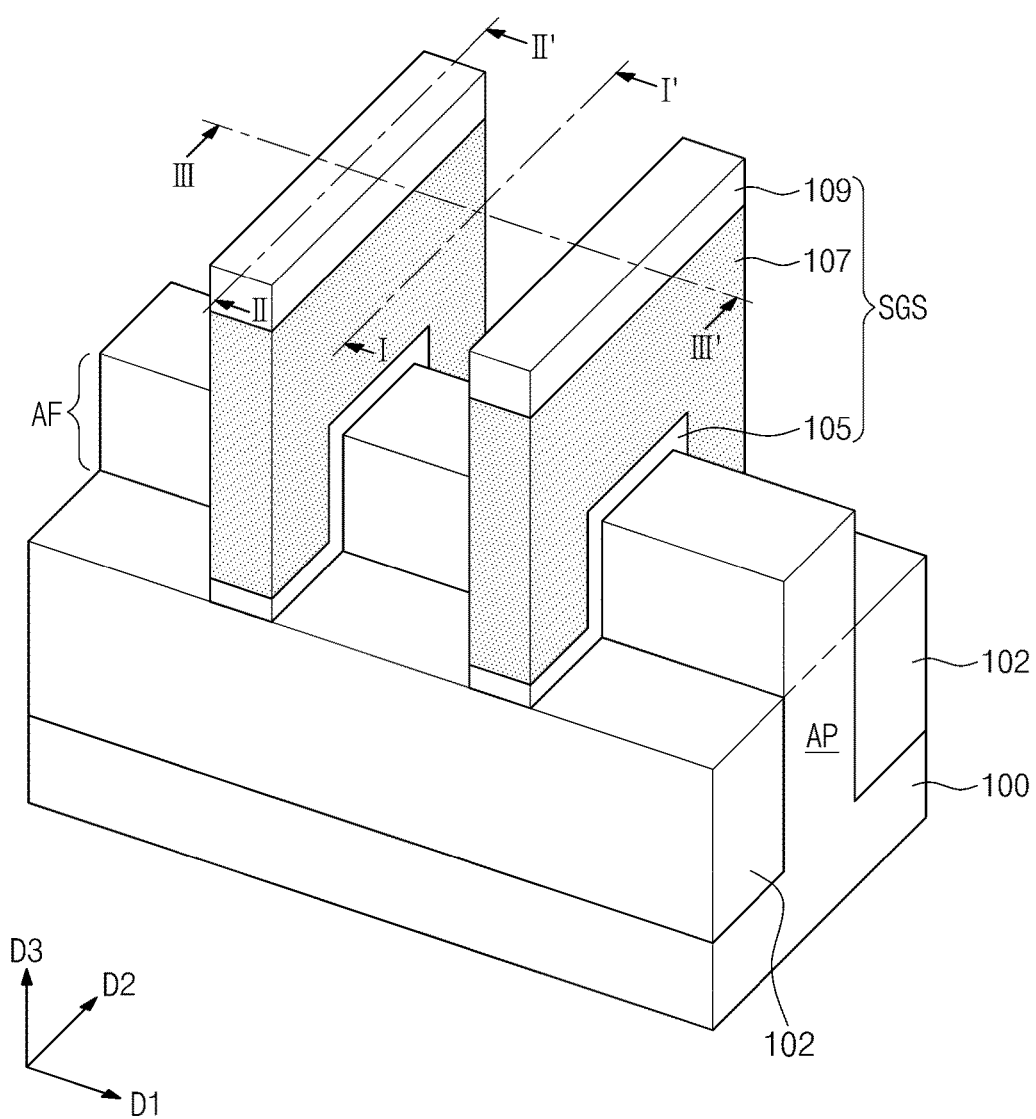
Figure 4B:
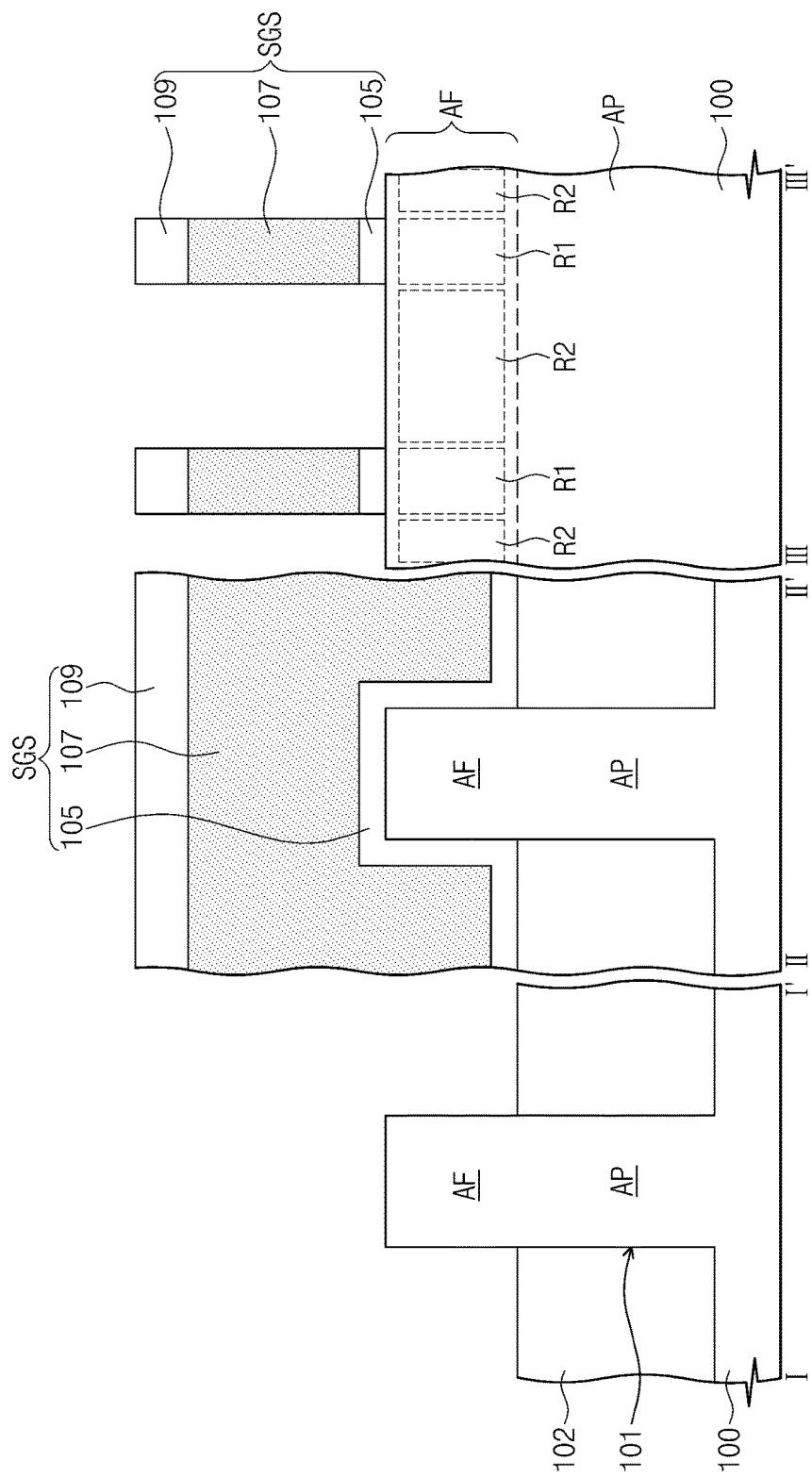

Next, the device isolation patterns 102 may be formed in the trenches 101 so that portions of the active pattern AP extend above a top surface of the device isolation patterns 102. In other words, the device isolation patterns 102 may be formed in such a way that top surfaces thereof are positioned below that of the active pattern AP. For example, the formation of the device isolation patterns 102 may include forming a device isolation layer on the substrate 100 to fill the trenches 101, and then, performing a planarizing process on the device isolation layer to expose a top surface of the mask pattern (not shown) remaining on the active pattern AP. Thereafter, the planarized device isolation layer may be vertically etched to form the device isolation patterns 102 exposing the upper sidewall of the active pattern AP. The device isolation layer may be formed of or include, for example, a silicon oxide layer, which may be formed by, for example, a chemical vapor deposition (CVD) process. The planarizing process of the device isolation layer may be performed using, for example, an etch-back and/or chemical mechanical polishing (CMP) process. The vertical etching of the planarized device isolation layer may be performed using, for example, a wet etching process, which is selected to be able to provide an etch selectivity with respect to the active pattern AP. Here, an upper portion of the active pattern AP extending above the device isolation patterns 102 may serve as the active fin AF. Referring to FIGS. 4A and 4B, an etch stop pattern 105 and a sacrificial gate pattern 107 may be formed on the substrate 100 to cross the active fin AF. The sacrificial gate pattern 107 may be formed on the etch stop pattern 105.

For example, an etch stop layer and a sacrificial gate layer may be sequentially formed on the substrate 100 to cover the active fin AF. As an example, the etch stop layer may be formed of or include a silicon oxide layer. The sacrificial gate layer may include a material having an etch selectivity with respect to the etch stop layer. For example, the sacrificial gate layer may be formed of or include a poly silicon layer. The sacrificial gate layer may be formed using, for example, one of chemical vapor deposition (CVD), physical vapor deposition (PVD), and atomic layer deposition (ALD) processes. A process may be performed to planarize the top surface of the sacrificial gate layer, after the formation of the sacrificial gate layer. A gate mask pattern 109 may be formed on the planarized sacrificial gate layer, and then, an anisotropic etching process may be performed on the sacrificial gate layer using the gate mask pattern 109 as an etch mask. Accordingly, the sacrificial gate pattern 107 may be formed to cross the active fin AF. In certain embodiments, a plurality of sacrificial gate patterns 107 may be formed to cross at least one of the active fins AF. For example, a pair of the sacrificial gate patterns 107 may be spaced apart from each other in the first direction D1 and may extend parallel to the second direction D2. The gate mask patterns 109 may be formed of or include, for example, a silicon nitride layer.

After the formation of the sacrificial gate patterns 107, the etch stop layer may be removed from top surfaces of the device isolation patterns 102 and active fin AF on both sides of the sacrificial gate patterns 107, thereby forming the etch stop patterns 105 localized below the sacrificial gate patterns 107. The etch stop patterns 105 may extend along a bottom surface of the sacrificial gate patterns 107 and cover partially top surfaces of the device isolation patterns 102.

Since the sacrificial gate patterns 107 are formed to cross the active fin AF, the active fin AF may be sectioned into first regions R1 and second regions R2 by the sacrificial gate patterns 107. Here, the first regions R1 may be portions of the active fin AF positioned below the sacrificial gate patterns 107, and the second regions R2 may be other portions of the active fin AF, which the pair of the sacrificial gate patterns 107 do not over lap (in a plan view). The etch stop pattern 105, the sacrificial gate pattern 107, and the gate mask pattern 109 may constitute a sacrificial gate structure SGS.

Figure 5A:
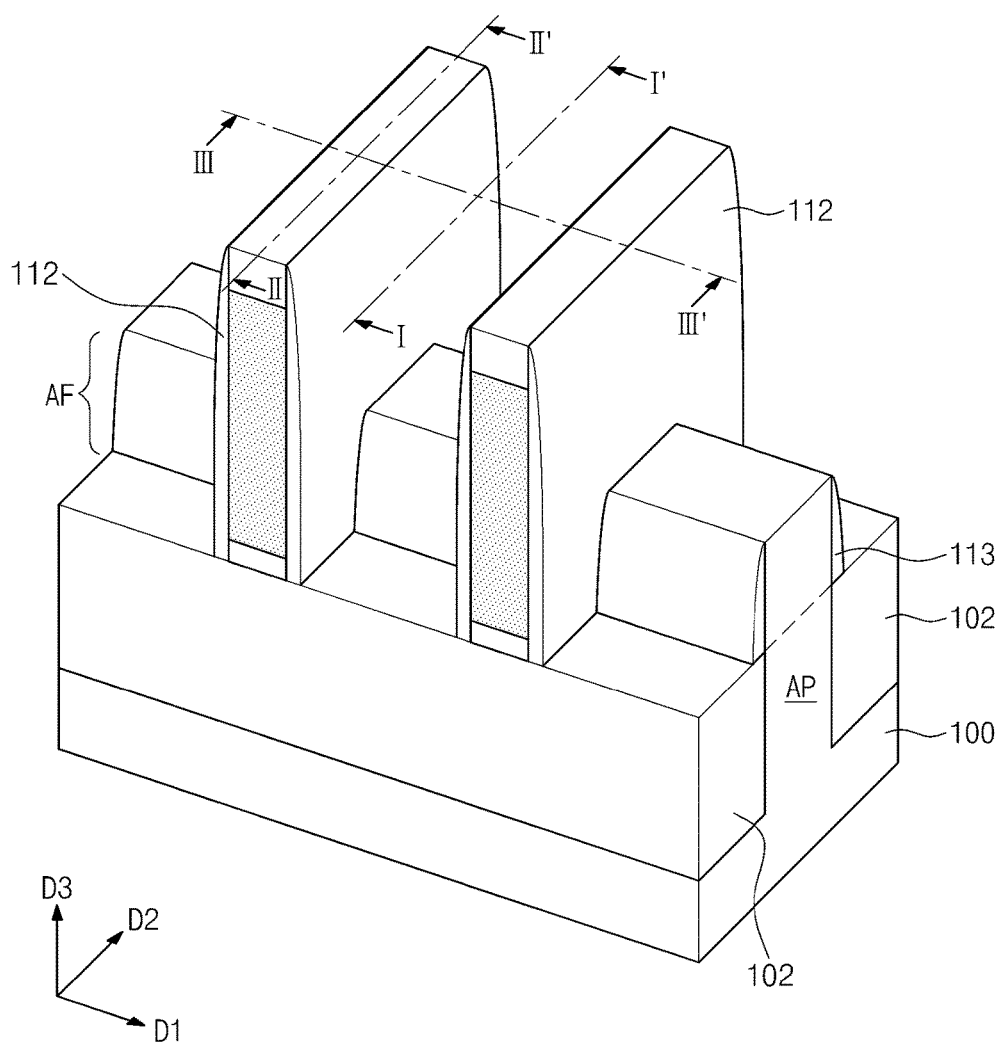
Figure 5B:
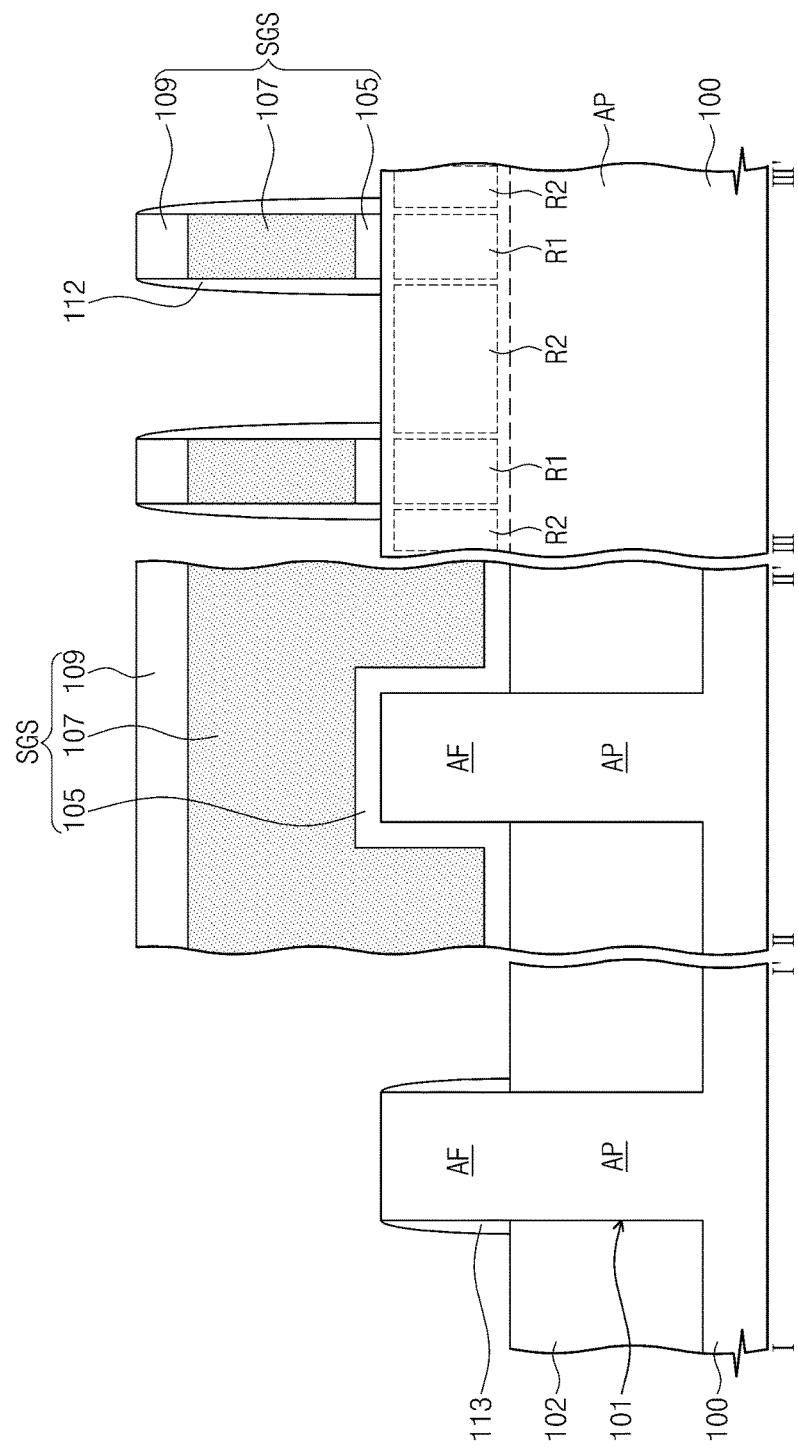

Referring to FIGS. 5A and 5B, the gate spacers 112 may be formed on both sidewalls of the sacrificial gate structure SGS. For example, the formation of the gate spacers 112 may include conformally forming a gate spacer layer on the substrate 100 with the sacrificial gate structures SGS and performing an anisotropic etching process on the gate spacer layer to expose top surfaces of the sacrificial gate structures SGS. The etching process may be performed to expose top surfaces of the second regions R2 of the active fin AF and top surfaces of the device isolation patterns 102 located at both sides of the second regions R2. In certain embodiments, after this etching process, the gate spacer layer may remain as fin spacers 113 on both sidewalls of the second regions R2. The gate spacer layer may be formed of or include, for example, a silicon nitride layer. In other embodiments, the gate spacer layer may include low-k nitrides, such as SiCN or SiOCN. The gate spacer layer may be formed using a deposition process such as CVD or ALD.

Figure 6A:
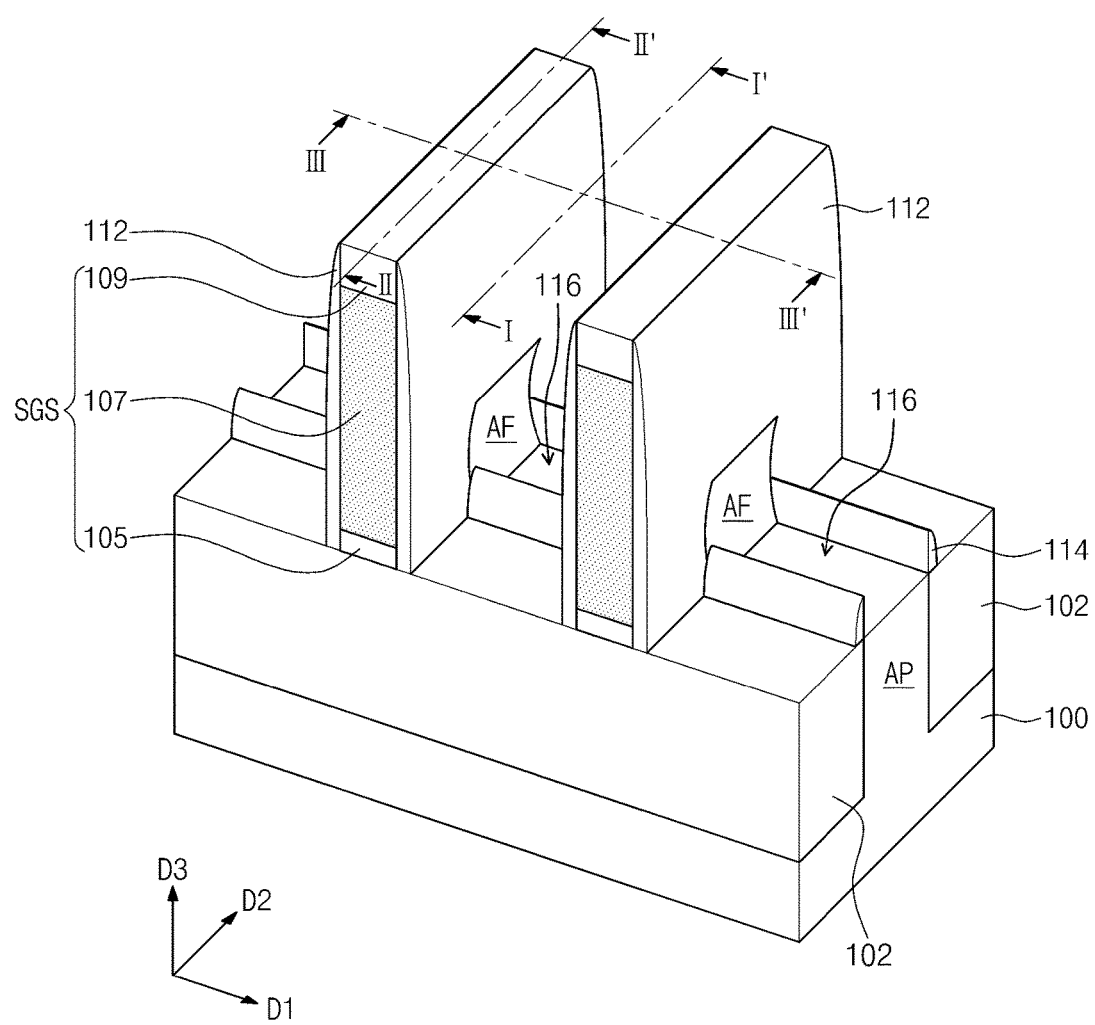
Figure 6B:
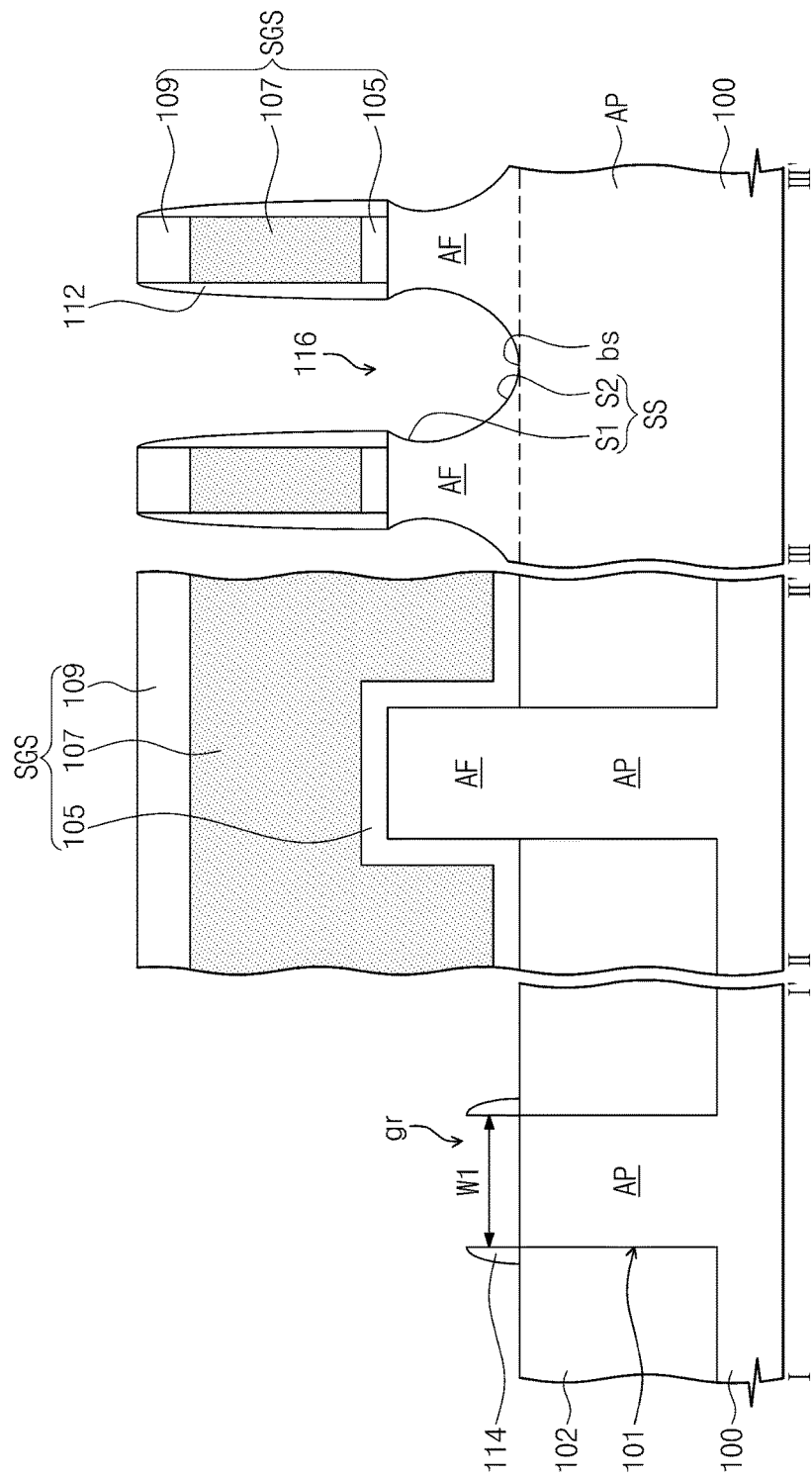

Referring to FIGS. 6A and 6B, the recessed regions 116 may be formed in portions of the active pattern AP positioned at both sides of the sacrificial gate structure SGS. For example, the recessed regions 116 may be formed by removing the second regions R2 of the active fin AF through an etching process, in which the gate mask pattern 109 and the gate spacers 112 are used as an etch mask. The recessed regions 116 are shown to be formed to a depth substantially equal to the top surface of the device isolation patterns 102, but may be formed to a height higher or lower than this height.

In example embodiments, the formation of the recessed regions 116 may include sequentially performing anisotropic and isotropic etching processes on the second regions R2 of the active fin AF. The anisotropic etching process may be performed to etch the second regions R2 in vertical direction (downwardly), and the isotropic etching process may be performed to etch the active fin AF in a lateral direction. Accordingly, each of the recessed regions 116 may be extend into the active fin AF formed under the sacrificial gate structure SGS to provide an undercut profile under the sacrificial gate structure SGS. As an example, the recessed region 116 may be formed in such a way that a width of the recessed region as viewed in a vertical cross section taken in parallel with direction D1 increases and then decreases from top to bottom (or bottom to top) as described with respect to FIGS. 1A, 1B and 2 herein. The recessed region 116 may have the bottom surface bs and the side surfaces SS having a curved or tapered profile and facing each other. In example embodiments, each of the side surfaces SS of the recessed region 116 may have first and second side surfaces S1 and S2, each of which includes a portion of (111) plane. As an example, the recessed region 116 between the first side surfaces S1 may have an increasing width in a downward direction, and the recessed region 116 between the second side surfaces S2 may have a decreasing width in the downward direction. Further, the bottom surface bs of each of the recessed regions 116 may include a portion of (100) plane. The recessed region 116 may have a sidewall SS shape that grows in width from top to bottom, starting from a height substantially equivalent to the top surface of the active fin AF. The shape may curve outward as such until reaching a maximum width, positioned below the gate spacer 112, before curving inward in the concave shape with reducing width until reaching the bottom surface bs.

The vertical profile of the recessed regions 116 may result from a difference in surface orientation and etch rates of semiconductor surfaces exposed in the etching process may differ. For example, in the isotropic etching process, the (111) plane may exhibit an etch rate lower than those of (100) and (110) planes, and thus, the (111) plane may serve as an etch stop layer in the isotropic etching process. The shape of the recessed region 116 may be defined by surfaces (i.e., the first and second side surfaces S1 and S2), whose crystal orientation is (111). In certain embodiments, a portion (hereinafter, "undercut region") of the recessed region 116, where the first and second side surfaces S1 and S2 meet each other, may have a laterally-curved or tapered shape that protrudes toward the active fin AF under the sacrificial gate structure SGS. The undercut region may be positioned below the gate spacer 112 but may not overlap the sacrificial gate pattern 107 (e.g., may not be directly under sacrificial gate pattern 107).

In example embodiments, the etching process for forming the recessed region 116 may be performed using an etch condition having a higher etch selectivity with respect to the fin spacers 113. During the etching process, an etch amount of the fin spacers 113 may be smaller than that of the active fin AF, and thus, the fin spacers 113 may remain on the device isolation patterns 102, even after the removal of the second regions R2 of the active fin AF. For example, the sidewall spacers 114, which are remaining portions of the fin spacers 113, may be formed on the device isolation patterns 102. The sidewall spacers 114 may be formed on the device isolation patterns 102, respectively, that are positioned at both sides of the sacrificial gate structure SGS, and may be spaced apart from each other in the second direction D2 with the active pattern AP therebetween. Each of the sidewall spacers 114 may extend along a boundary between the active pattern AP and device isolation pattern 102, which are positioned adjacent thereto, thereby being in contact with the gate spacer 112. Accordingly, the sidewall spacers 114 may define grooves gr. For example, the grooves gr may be formed on the active pattern AP between a pair of the sacrificial gate structures SGS and at both sides thereof. The grooves gr may have a first width W1 in the second direction. The grooves gr may be portions of the recessed regions 116.

Figure 7A:
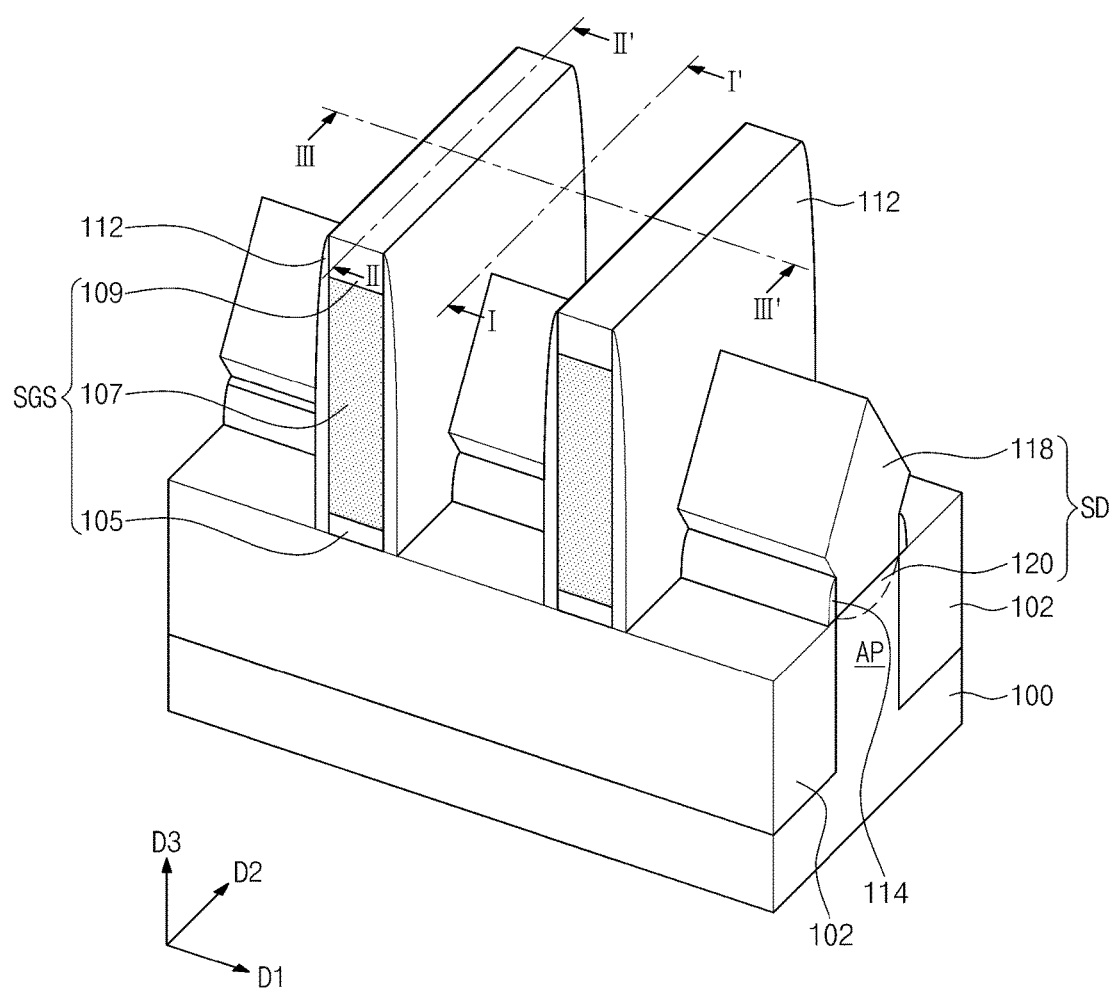
Figure 7B:
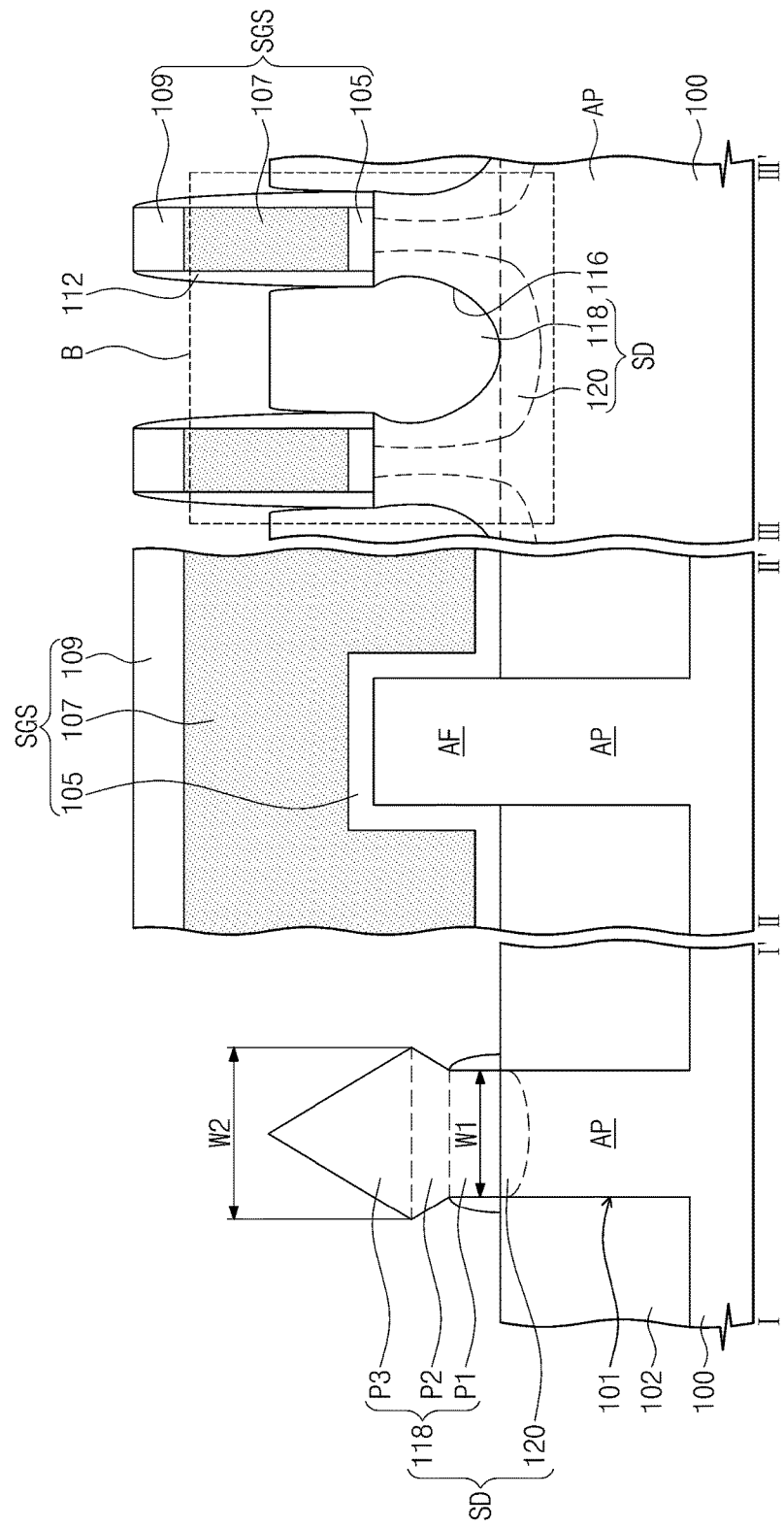
Figure 8:
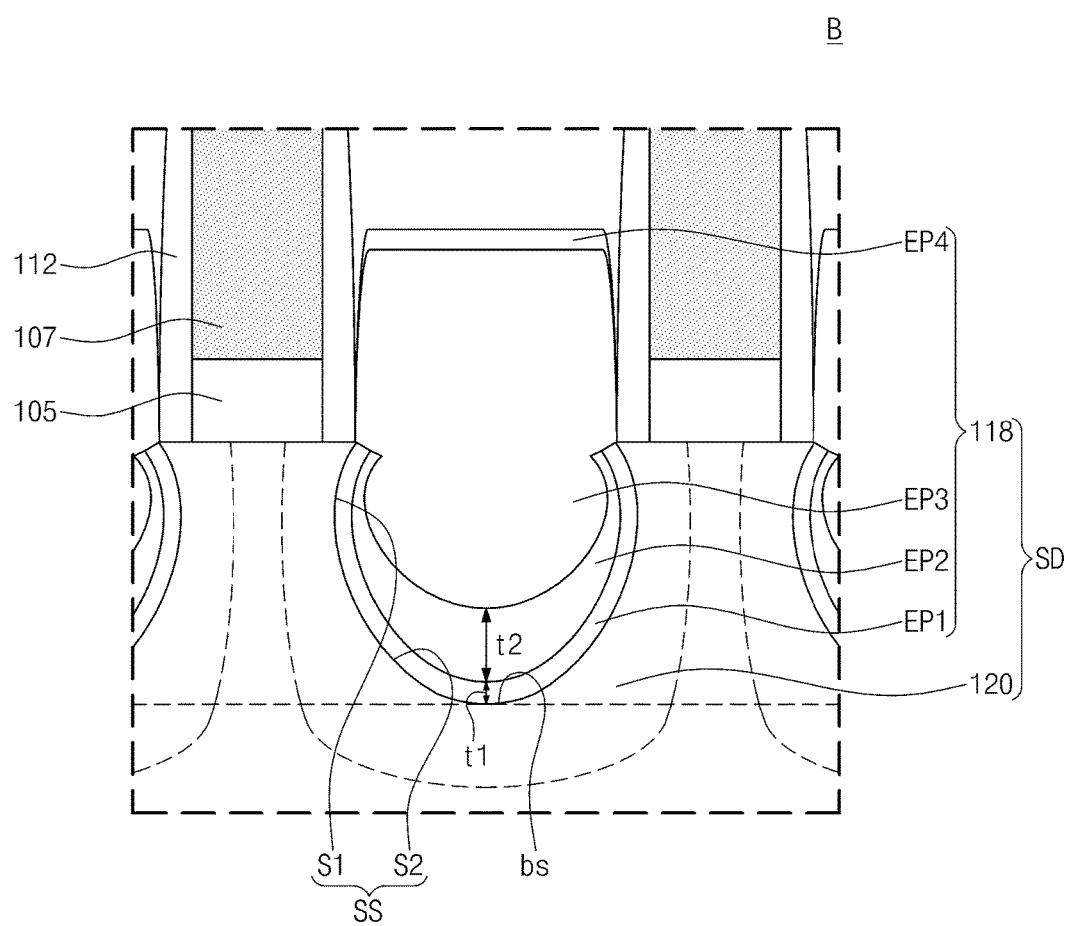
FIG. 8 is an enlarged view of portion B of FIG. 7B.

Referring to FIGS. 7A, 7B, and 8, the source/drain epitaxial layer 118 may be formed in the recessed region 116.

The formation of the source/drain epitaxial layer 118 may include a selective epitaxial growth process, in which the surface of the active pattern AP exposed by the recessed region 116 is used as a seed layer. For example, the sidewall of the active fins AF defining the recessed region 116 and the top surface of the active pattern AP therebetween may be used as the seed layer in the selective epitaxial growth process. The source/drain epitaxial layer 118 may include a semiconductor material, whose lattice constant is different from that of the substrate 100, and may be formed to include a plurality of epitaxial layers.

In example embodiments, the source/drain epitaxial layer 118 may include the first to fourth epitaxial layers EP1-EP4, which may be sequentially formed in the recessed region 116. The first epitaxial layer EP1 may be formed of a lightly-doped epitaxial semiconductor layer. In certain embodiments, the first epitaxial layer EP1 may be formed to have the second conductivity type, and the doping of the first epitaxial layer EP1 may be performed in an in-situ doping manner. As an example, the first epitaxial layer EP1 may be a silicon germanium layer, which is in-situ doped with boron (e.g., doped with boron by epitaxially growing the first epitaxial layer EP1 with boron (charge carrier dopants) in the same process chamber at the same time). Here, the first epitaxial layer EP1 may be formed to have a germanium concentration less than 30 at % and a boron concentration ranging from $1\times10^{18}$ to $1\times10^{19}$ atom/cm$^3$. The first epitaxial layer EP1 may be formed by a first selective epitaxial growth process using the active pattern AP exposed by the recessed region 116 as the seed layer. In example embodiments, the first selective epitaxial growth process may be performed under pressure condition(s) higher than those of the second and third selective epitaxial growth process to be described below. As an example, the first selective epitaxial growth process may be performed under pressure ranging from 50 Torr to 300 Torr. This may assist conformally forming the first epitaxial layer EP1 on an inner surface of the recessed region 116. The first epitaxial layer EP1 may have a first thickness t1, which is given as a vertical thickness from the bottom surface bs of the recessed region 116.

The second epitaxial layer EP2 may be formed of a highly-doped epitaxial semiconductor layer. In certain embodiments, the second epitaxial layer EP2 may be formed to have the second conductivity type, and the doping of the second epitaxial layer EP2 may be performed in an in-situ doping manner. As an example, the second epitaxial layer EP2 may be a silicon germanium layer, which is in-situ doped with boron. Here, the second epitaxial layer EP2 may be formed to have a germanium concentration ranging from 30 at % to 70 at % and a boron concentration approximately equal to or higher than $1 \times 10^{21}$ atom/cm$^3$. The second epitaxial layer EP2 may be formed by a second selective epitaxial growth process using the first epitaxial layer EP1 as a seed layer. The second selective epitaxial growth process may be performed under pressure conditions lower than that in the first selective epitaxial growth process. For example, the second selective epitaxial growth process may be performed under a pressure ranging from 10 Torr to 30 Torr. In this case, the second epitaxial layer EP2 may be thicker on the bottom surface bs than on the side surfaces SS of the recessed region 116. The second epitaxial layer EP2 may have a second thickness t2, as measured from the bottom surface bs of the recessed region 116 in the vertical direction. The second thickness of the second epitaxial layer EP2 may be larger than the first thickness of the first epitaxial layer EP1.

The third epitaxial layer EP3 may be formed of a highly-doped epitaxial semiconductor layer. In certain embodiments, the third epitaxial layer EP3 may be formed to have the second conductivity type, and the doping concentration of the third epitaxial layer EP3 may be higher than that of the first epitaxial layer EP1 and lower than that of the second epitaxial layer EP2. For example, the third epitaxial layer EP3 may be formed of a silicon germanium layer, which is in-situ doped with boron. Here, the third epitaxial layer EP3 may be formed to have a germanium concentration ranging from 30 at % to 70 at %, and a boron concentration thereof may range from $1 \times 10^{20}$ atom/cm$^3$ to $1 \times 10^{21}$ atom/cm$^3$. The third epitaxial layer EP3 may be formed by a third selective epitaxial growth process using the second epitaxial layer EP2 as a seed layer. The third selective epitaxial growth process may be performed under pressure conditions ranging from 10 Torr to 100 Torr.

The fourth epitaxial layer EP4 may be formed by a fourth selective epitaxial growth process using the third epitaxial layer EP3 as a seed layer. The fourth epitaxial layer may be formed of or include the same material as the substrate 100. For example, the fourth epitaxial layer EP4 may be formed of a silicon layer. The first to fourth selective epitaxial growth processes may be continuously performed within the same chamber.

The source/drain epitaxial layer 118 may be formed to fill the groove gr shown in FIG. 6B. In example embodiments, when viewed in a vertical section taken in the second direction D2, the source/drain epitaxial layer 118 may include the first portion P1 filling the groove gr, the second portion P2, whose width increases in a direction away from the substrate 100, and the third portion P3, whose width substantially decreases in the direction away from the substrate 100. In this case, the first portion P1 of the source/drain epitaxial layer 118 may have a width corresponding to the first width W1 of the groove gr. Further, the source/drain epitaxial layer 118 may have the second width W2, which is the maximum width thereof, at a height level of an interface between the second and third portions P2 and P3. According to example embodiments, the sidewall spacers 114 may include nitride. During the selective epitaxial process to form the source/drain epitaxial layer 118, the migration of the particles constituting the source/drain epitaxial layer 118 may be easier in the nitride than in the oxide. Vertical migration of particles in the source/drain epitaxial layer 118 may increase on a sidewall of the sidewall spacers 114 which is formed of nitride. Thus, the (100) plane of the first portion P1 of the source/drain epitaxial layer 118 may be easily grown and the first portion P1 of the source/drain epitaxial layer 118 may be formed of a uniformly grown epitaxial layer.

An annealing process may be performed after the formation of the source/drain epitaxial layer 118. The annealing process may be performed to cause thermal diffusion of impurities from the source/drain epitaxial layer 118 to the active pattern AP, and thus, the impurity diffusion region 120 of second conductivity type may be formed in the active pattern to enclose the source/drain epitaxial layer 118 along an inner surface of the recessed region 116. The impurity diffusion region 120 may be formed in the active fins AF adjacent to the source/drain epitaxial layer 118 (and may extend under the sacrificial gate structure SGS, such as under the sacrificial gate pattern 107) and in the active pattern AP below the source/drain epitaxial layer 118. According to example embodiments described above where the source/drain epitaxial layer 118 is doped with boron, the impurity diffusion region 120 may have a boron concentration ranging from $1 \times 10^{17}$ to $1 \times 10^{19}$ atom/cm$^3$. The boron concentration of the impurity diffusion region 120 may continuously decrease with increasing distance from the source/drain epitaxial layer 118.

According to example embodiments, the second epitaxial layer EP2 may be formed to have an impurity concentration higher than that of the third epitaxial layer EP3. Accordingly, a depth of impurity diffusion into the active pattern AP may be larger for impurities in the second epitaxial layer EP2 than for those in the third epitaxial layer EP3. As a result, the impurity diffusion region 120, active fin AF, and the active pattern AP may form a 'U'-shaped junction at an interface therebetween (e.g., as shown in FIG. 8 and the right side of FIG. 7B). The source/drain epitaxial layer 118 and the impurity diffusion region 120 may serve as the source/drain region SD for 3D FETs according to example embodiments.

Figure 9A:
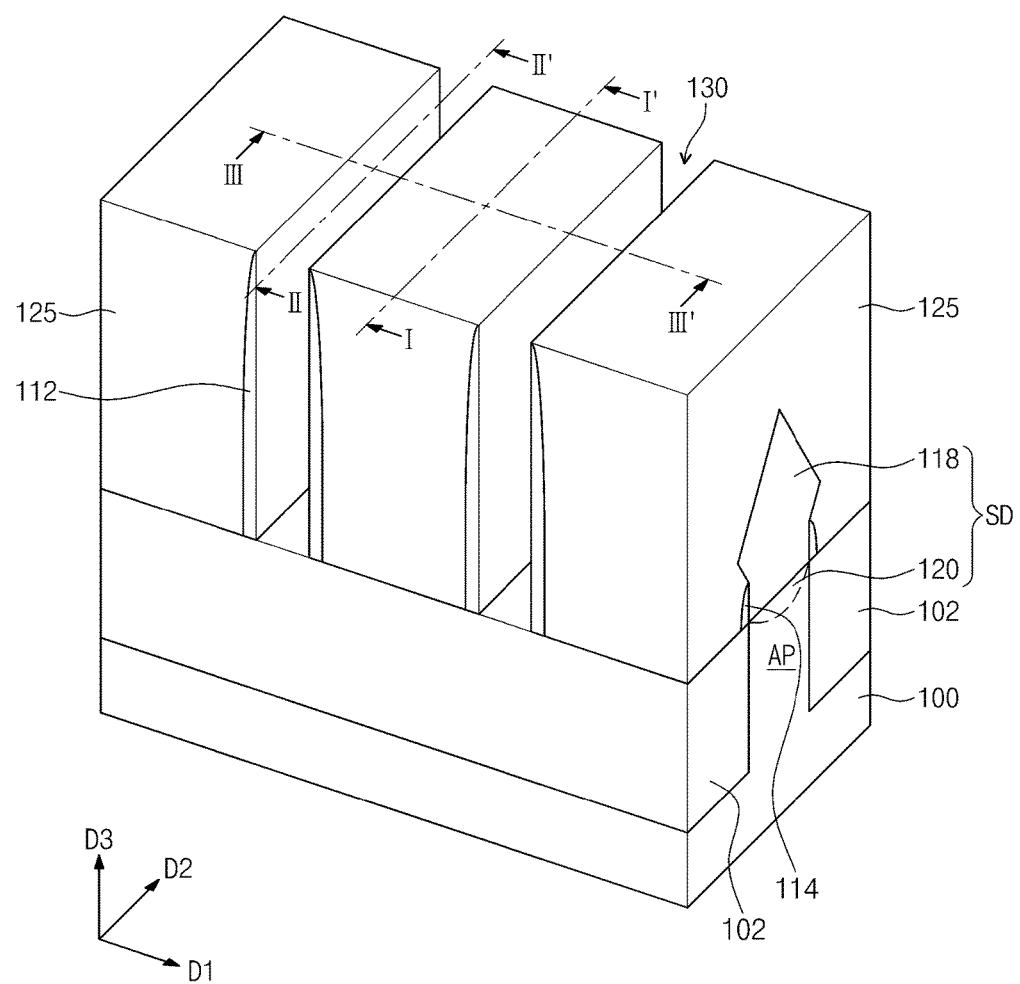
Figure 9B:
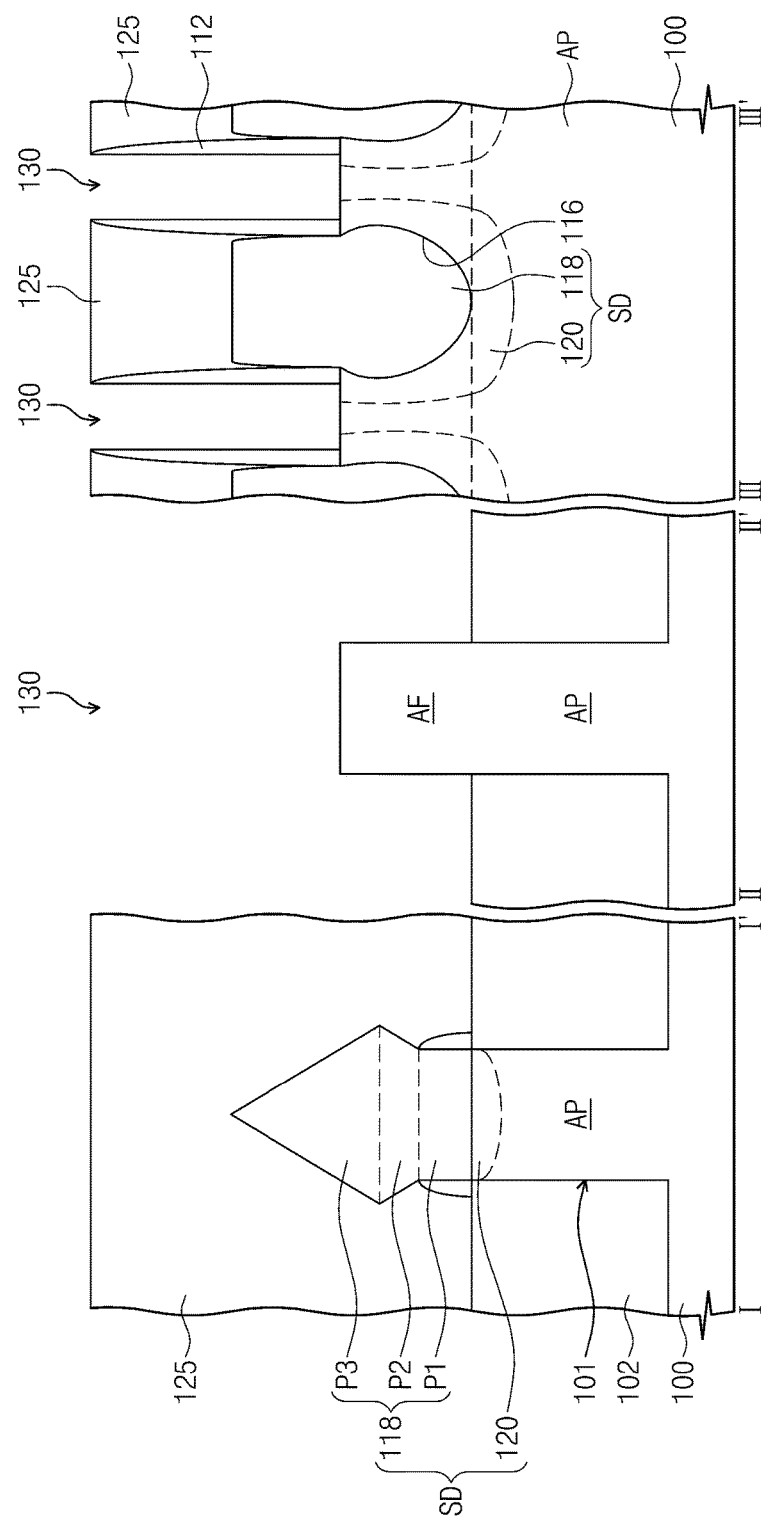

Referring to FIGS. 9A and 9B, the lower interlayer insulating layer 125 may be formed on the resulting structure with the source/drain regions SD. The lower interlayer insulating layer 125 may be formed to cover the source/drain regions SD and the sacrificial gate structures SGS. The lower interlayer insulating layer 125 may be formed of or include, for example, at least one of a silicon oxide layer, a silicon nitride layer, a silicon oxynitride layer, or low-k dielectric layers. Thereafter, a planarization process may be performed on the lower interlayer insulating layer 125 to expose top surfaces of the sacrificial gate patterns 107. The planarization process may be performed using, for example, an etch-back and/or chemical mechanical polishing (CMP) process.

Thereafter, the sacrificial gate patterns 107 and the etch stop patterns 105 may be removed to form gap regions 130 exposing the active fins AF between the gate spacers 112 (see FIGS. 9A and 9B). The gap region 130 may be formed to extend parallel to the second direction D2. The gap region 130 may be formed by selectively removing the sacrificial gate patterns 107 and etch stop patterns 105 using an etching process.

Referring back to FIGS. 1A and 1B, the gate dielectric pattern 135 and the gate electrode 140 may be sequentially formed in the gap region 130. For example, a gate dielectric layer may be formed on the resulting structure within the gap region 130. The gate dielectric layer may be conformally formed not to fill the whole region of the gap region 130. In other words, the gate dielectric layer may be formed to cover the active fin AF, the sidewall of the gate spacers 112 exposed by the gap regions 130, and the top surface of the lower interlayered insulating layer 125 with substantially the same thickness. In example embodiments, the gate dielectric layer may be formed of or include a high-k dielectric layer, whose dielectric constant is higher than that of silicon oxide. For example, the gate dielectric layer may include at least one of hafnium oxide, hafnium silicate, zirconium oxide, or zirconium silicate. The gate dielectric layer may be formed by a CVD or ALD process.

Thereafter, a gate electrode layer may be formed on the gate dielectric layer to fill the gap region 130, and a planarization process may be performed on the gate electrode layer and the gate dielectric layer to expose the top surface of the lower interlayered insulating layer 125. Accordingly, the gate dielectric pattern 135 and the gate electrode 140 may be localized within the gap region 130. The gate dielectric pattern 135 and the gate electrode 140 may extend parallel to the second direction D2. In example embodiments, the gate electrode layer may include at least one metal layer. For example, the gate electrode layer may be formed of or include at least one of titanium, tungsten, tantalum, or aluminum. Alternatively, the gate electrode layer may include a conductive metal nitride layer (e.g., titanium nitride or tantalum nitride) and a metal layer (e.g., aluminum or tungsten). The gate electrode 140, the gate spacer 112, and the gate dielectric pattern 135 may constitute the gate structure GS.

Although not shown, an upper interlayer insulating layer (not shown) may be formed on the resulting structure with the gate structures GS. The upper interlayer insulating layer may include oxide, nitride, and/or oxynitride. Next, contact holes (not shown) may be formed to penetrate the upper interlayer insulating layer and the lower interlayered insulating layer 125 and expose the source/drain regions SD. Contact plugs (not shown) may be formed in the contact holes, respectively. In addition, interconnection lines (not shown) may be formed on the upper interlayer insulating layer to be connected to the contact plugs. The interconnection lines may be electrically connected to the source/drain regions SD, respectively, through the contact plugs. The contact plugs and the interconnection lines may include a conductive material.

Figure 10A:
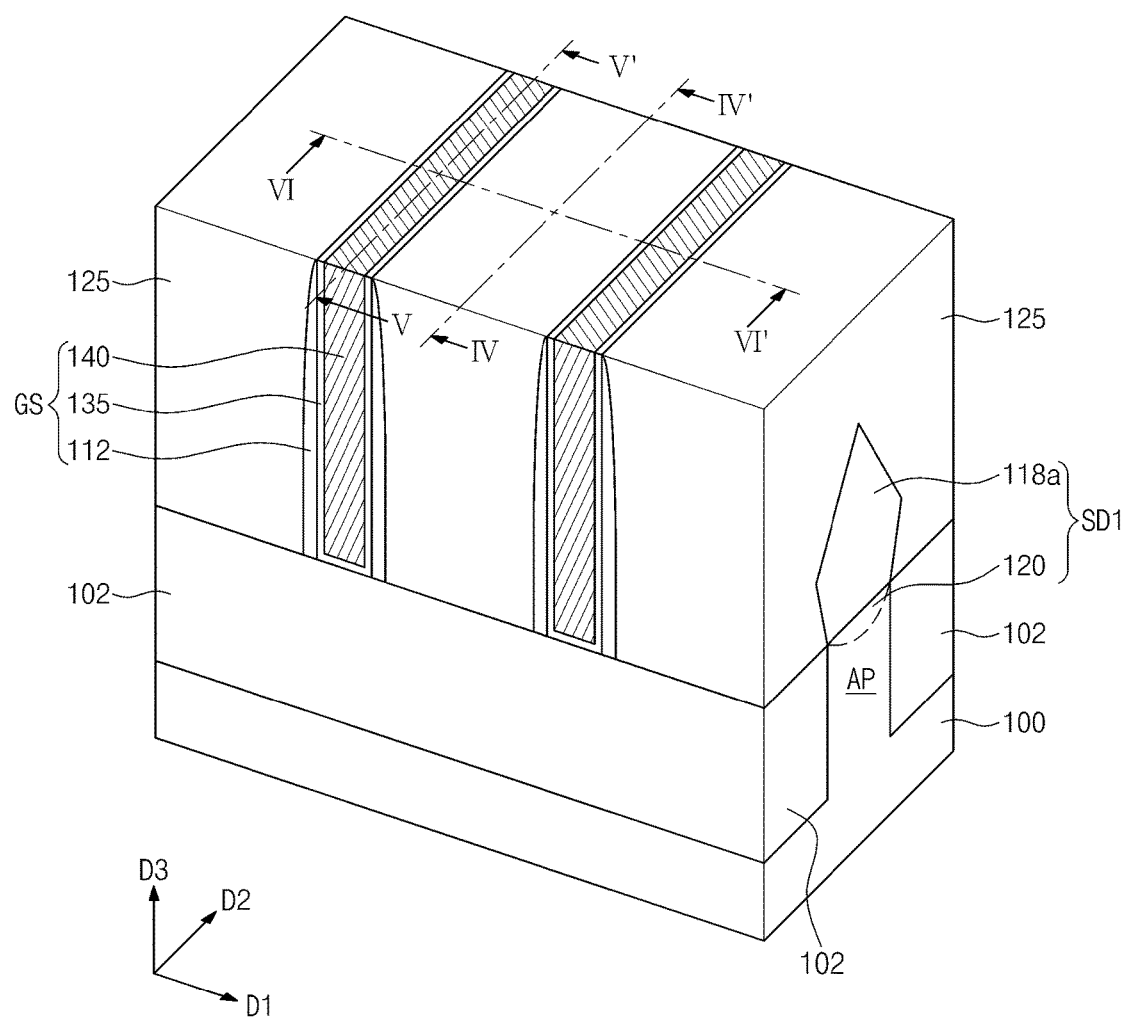
FIG. 10A is a perspective view illustrating a semiconductor device according to example embodiments.
Figure 10B:
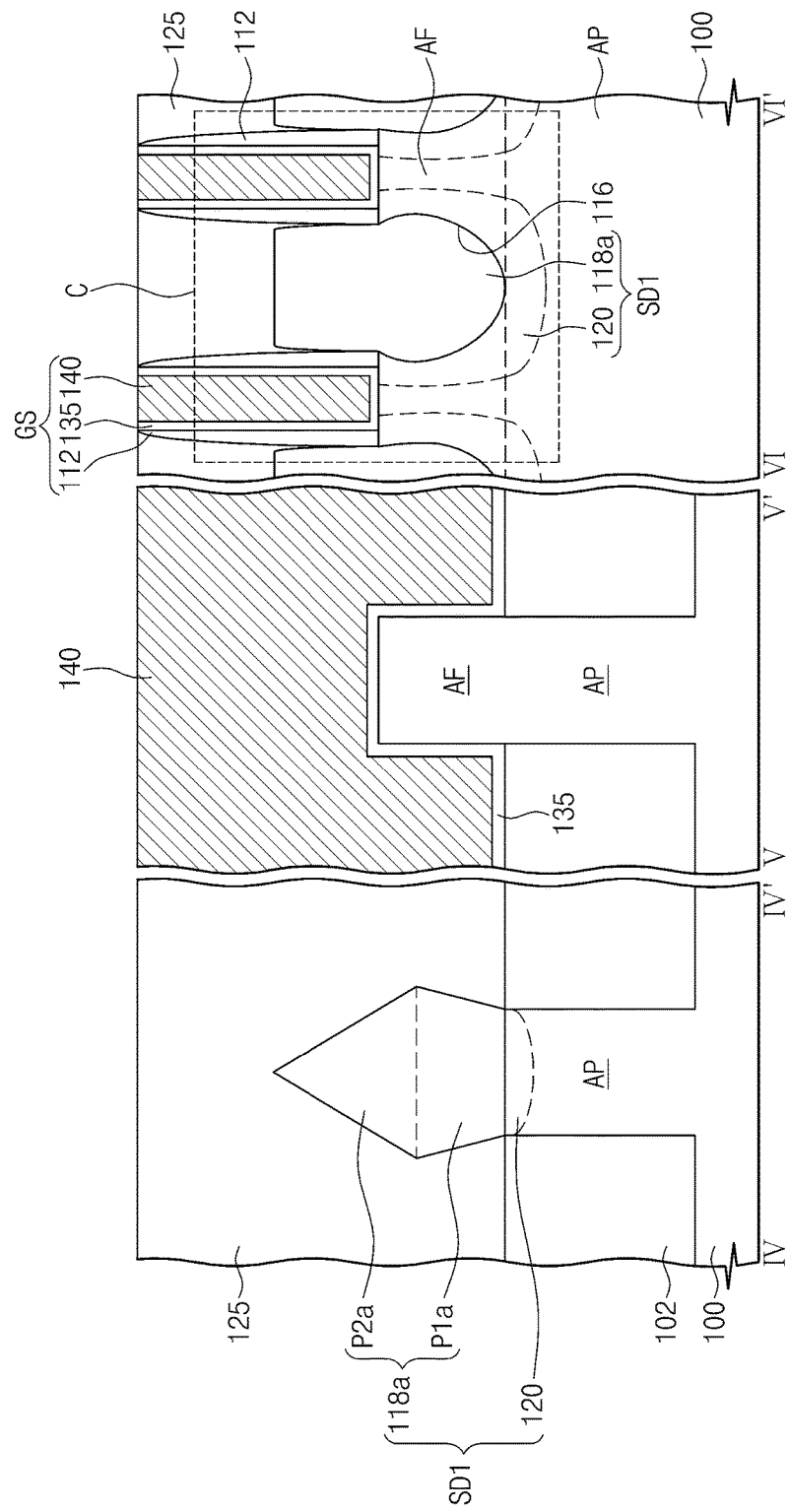
FIG. 10B is a sectional view illustrating vertical sections taken along lines IV-IV', V-V', and VI-VI' of FIG. 10A.
Figure 11:
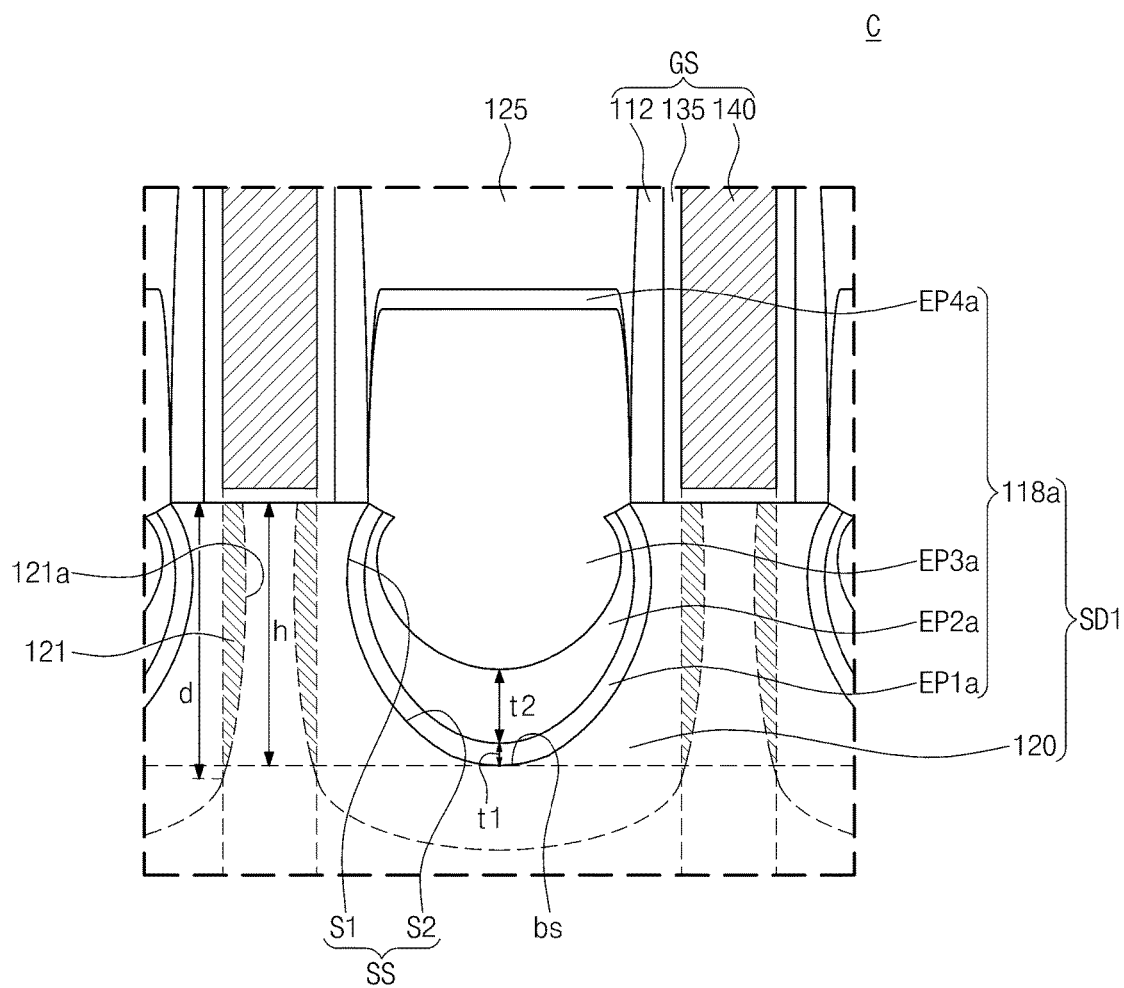
FIG. 11 is an enlarged view of portion C of FIG. 10B.

FIG. 10A is a perspective view illustrating a semiconductor device according to other example embodiments, and FIG. 10B is a sectional view illustrating vertical sections taken along lines IV-IV', V-V', and VI-VI' of FIG. 10A. FIG. 11 is an enlarged view of a portion C of FIG. 10B. Except for the absence of the sidewall spacers 114 and the consequent difference in shape of the source/drain epitaxial layer 118, a semiconductor device of FIGS. 10A and 10B may be configured to have substantially the same features as those of the previous embodiments of FIGS. 1A and 1B. For convenience in description, the aforesaid technical features may be omitted below.

Referring to FIGS. 10A and 10B, a source/drain epitaxial layer 118a may be provided on the active pattern AP between a pair of the gate structures GS and at both sides thereof. For example, the source/drain epitaxial layer 118a may be provided in the recessed region 116 positioned in the active pattern AP and at a side of the gate structure GS. The source/drain epitaxial layer 118a may include first to fourth epitaxial layers EP1a-EP4a, which are formed using the active pattern AP exposed by the recessed region 116 as a seed layer. The first to fourth epitaxial layers EP1a-EP4a may be formed of substantially the same materials and by substantially the same methods as those of the first to fourth epitaxial layers EP1-EP4 of FIGS. 1A, 1B, and 2.

In example embodiments, when viewed in a vertical cross section taken along the second direction D2, the source/drain epitaxial layer 118a may include the first portion P1a, which is in contact with the active pattern AP and has a width increasing with increasing distance from the active pattern AP, and the second portion P2a, which has a width decreasing with increasing distance from the active pattern AP. Accordingly, the source/drain epitaxial layer 118a may have a maximum width at a level of an interface of the first and second portions P1a and P2a. The source/drain epitaxial layer 118a and the impurity diffusion region 120 enclosing the same may constitute a source/drain region SD1.

A fabricating method of a semiconductor device, according to other example embodiments, may be performed in substantially the same manner as that of the previous embodiments described with reference to FIGS. 1A through 7A, 9A, 1B through 7B, and 9B, except that the fin spacers 113 (e.g., of FIGS. 5A and 5B) are completely removed when the second regions R2 are removed (e.g., in the step of FIGS. 6A and 6B).

Figure 12:
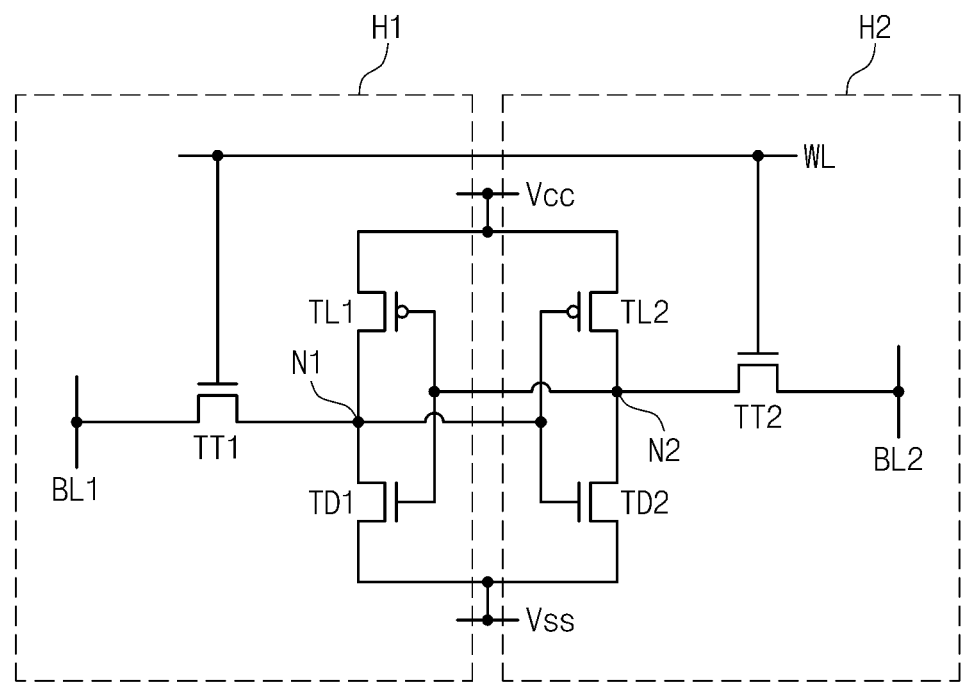
FIG. 12 is an equivalent circuit diagram illustrating a CMOS SRAM cell according to example embodiments.

FIG. 12 is an equivalent circuit diagram illustrating a CMOS SRAM cell according to example embodiments. Referring to FIG. 12, the CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors. At least one of the load transistors TL1 and TL2 may be provided in the form of the field effect transistor according to at least one of the foregoing example embodiments the present disclosure.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may serve as a first node N1. The drain region of the second load transistor TL2, the drain region of the second driver transistor TD2, and a source region of the second transfer transistor TT2 may serve as a second node N2. A gate electrode of the first driver transistor TD1 and the first load transistor TL1 may be electrically connected to the second node N2, and a gate electrode of the second driver transistor TD2 and the second load transistor TL2 may be electrically connected to the first node N1. The gate electrodes of the first and second transfer transistors TT1 and TT2 may be electrically connected to a word line WL. The first driver transistor TD1, the first transfer transistor TT1, and the first load transistor TL1 may constitute a first half cell H1, while the second driver transistor TD2, the second transfer transistor TT2, and the second load transistor TL2 may constitute a second half cell H2.

Example embodiments may not be limited to the example of SRAM, and may be applied or modified to realize a logic device, DRAM, MRAM, other semiconductor devices, and fabricating methods thereof.

Figure 13:
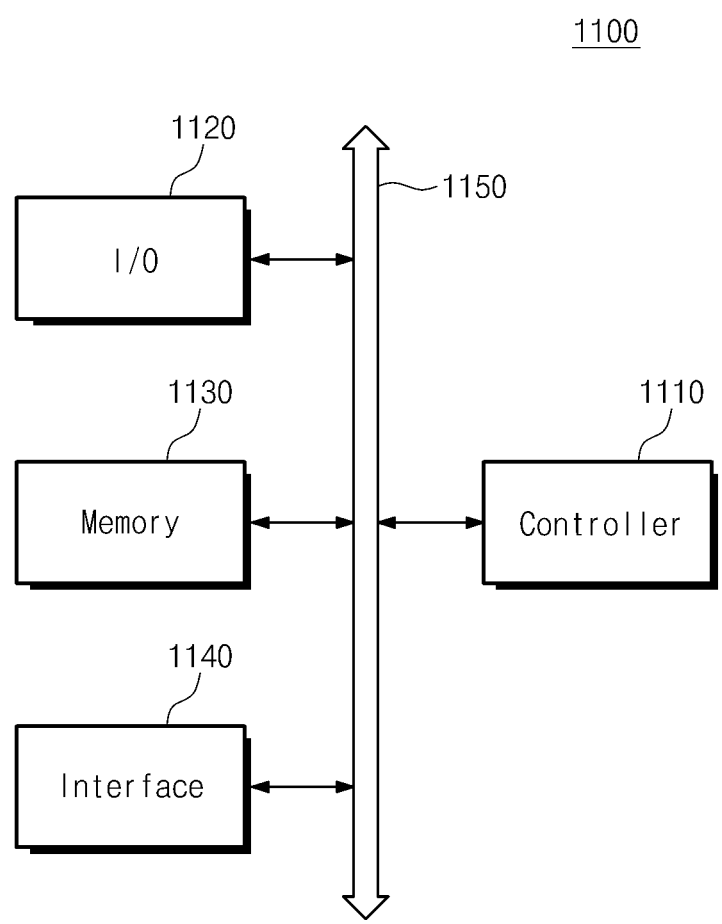
FIG. 13 is a schematic block diagram illustrating an example of electronic systems according to example embodiments.

FIG. 13 is a schematic block diagram illustrating an example of electronic systems according to example embodiments.

Referring to FIG. 13, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device, which acts as a cache memory for improving an operation of the controller 1110. A semiconductor device according to the example embodiments described herein may be provided in the memory device 1130 or as a part of the controller 1110 and/or the I/O unit 1120.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data wirelessly.

Figure 14:
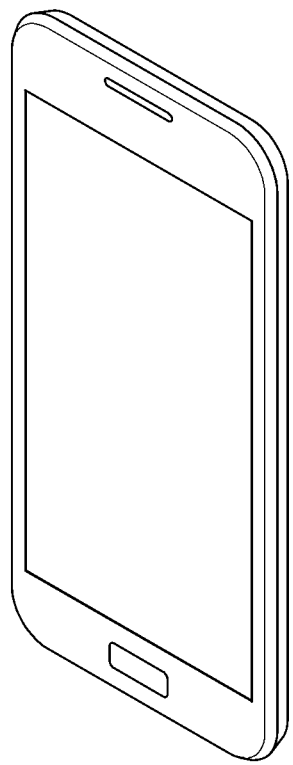
FIG. 14 is an illustration of an example electronic device.

FIG. 14 is a schematic view illustrating an example electronic device of the inventive concept. As shown in FIG. 14, the electronic system 1100 can comprises a mobile phone 1200 which may comprise the electronic system 1100 of FIG. 13. However, it will be understood that, in other embodiments, the electronic system 1100 of FIG. 13 may be embodied in, for example, portable notebook computers, MP3 players, navigators, solid state disks (SSDs), automobiles, and/or household appliances.

According to example embodiments, by controlling a doping concentration of a source/drain epitaxial layer, an impurity diffusion region may be formed to have a substantially 'U'-shape section. Accordingly, even in an example embodiment where an active fin in contact with the source/drain epitaxial layer has a concave sidewall, an electrical junction can have a 'U'-shape profile.

While example embodiments have been particularly shown and described, it will be understood by one of ordinary skill in the art that variations in form and detail may be made therein without departing from the spirit and scope of the attached claims. For example, although the above embodiments related to PMOS transistors and their formation, alternative embodiments also contemplate NMOS transistors and their formation. In these alternatives, the source region and drain region (source/drain regions) may be formed by epitaxially growing SiC to induce a tensile strain in a silicon channel region of the NMOS transistor. The source/drain regions may have similar structure to that described above, except that a carbon concentration is varied with respect to adjacent epitaxial layers of the source/drains rather than germanium. It will also be appreciated that the NMOS transistor may be implemented with a p-type doped channel region. In other alternatives, materials other than SiGe, SiC and S1 may be used to form PMOS and NMOS transistors so as to provide strained channel transistors with source/drain regions having varied ratios/concentrations of semiconductor materials as described herein.

What is claimed is:

1. A semiconductor device, comprising:
a substrate provided with an elongated active pattern, the active pattern including a recess and first and second active fins, the recess having a first side surface defined by a sidewall of the first active fin, a second side surface defined by a sidewall of the second active fin, and a bottom surface between the first and second side surfaces;
an epitaxial source/drain region in the recess, the epitaxial source/drain region comprising a first epitaxial layer covering the first and second side surfaces and the bottom surface of the recess, a second epitaxial layer on the first epitaxial layer, and a third epitaxial layer on the second epitaxial layer; and
a gate electrode extending across the first fin,
wherein the first, second and third epitaxial layers each comprise a compound semiconductor material comprised of a first semiconductor element and a second semiconductor element and are each doped with a charge carrier impurity,
wherein a thickness of the second epitaxial layer increases gradually from the first side surface of the recess to reach a maximum value on the bottom surface of the recess, then decreases gradually toward the second side surface of the recess,
wherein the atomic percentage of the second semiconductor element in the first epitaxial layer is less than the atomic percentage of the second semiconductor element in the second epitaxial layer and less than the atomic percentage of the second semiconductor element in the third epitaxial layer, and
wherein a concentration of charge carrier impurity in the second epitaxial layer is higher than a concentration of the charge carrier impurity in the third epitaxial layer.

2. The semiconductor device of claim 1, wherein the active pattern comprises the first semiconductor element.

3. The semiconductor device of claim 1, wherein a concentration of charge carrier impurity in the first epitaxial layer is lower than a concentration of the charge carrier impurity in the second epitaxial layer and lower than a concentration of the charge carrier impurity in the third epitaxial layer.

4. The semiconductor device of claim 1, wherein the first and second semiconductor elements are group IV type semiconductor materials.

5. The semiconductor device of claim 1, wherein the epitaxial source/drain region comprises a portion of a first source/drain region, the first source/drain region also comprising an impurity diffusion source/drain portion comprising portions of the active pattern located under the gate electrode with the charge carrier impurity diffused therein, the portions of the active pattern with the charge carrier impurity extending along a side of the recess from the bottom surface of the recess to a top of the recess.

6. The semiconductor device of claim 1, wherein the second epitaxial layer is thicker than the first epitaxial layer.

7. A semiconductor device, comprising:
an active pattern protruding from a substrate, the active pattern comprising a recess having a bottom surface and side surfaces that face each other and having a curved profile in a cross sectional view taken in a first direction parallel to a length direction of the active pattern;
first and second gate structures crossing the active pattern and extending in a second direction crossing the first direction, each of the first and second gate structures comprising a gate electrode and a gate spacer on a sidewall of the gate electrode, the first gate structure being adjacent to the second gate structure with the recess of the active pattern positioned between the first gate structure and the second gate structure;
a source/drain epitaxial layer in the recess, the source/drain epitaxial layer including a first portion in contact with the active pattern, a second portion extending from the first portion, and a third portion extending from the second portion; and
a pair of sidewall spacers formed directly on both sidewalls of the first portion of the source/drain epitaxial layer,
wherein, in a vertical cross sectional view taken in the second direction, a width of the second portion in the second direction increases in an upward direction and a width of the third portion in the second direction decreases in the upward direction,
wherein the pair of sidewall spacers are spaced apart from each other in the second direction,
wherein the source/drain region comprises a source/drain epitaxial layer formed in the recess, wherein the source/drain epitaxial layer comprise a first epitaxial layer in contact with the bottom and side surfaces of the recess, a second epitaxial layer on the first epitaxial layer, and a third epitaxial layer on the second epitaxial layer,
wherein the first to third epitaxial layers are doped with the same impurities, and
wherein the third epitaxial layer has an impurity concentration that is higher than that of the first epitaxial layer and lower than that of the second epitaxial layer.

8. The semiconductor device of claim 7,
wherein the active pattern comprises first and second active fins respectively positioned below the first and second gate structures, and
wherein the side surfaces of the recess are defined by sidewalls of the first and second active fins.

9. The semiconductor device of claim 8, wherein each of the side surfaces of the recess comprises a first side surface and a second side surface,
wherein a width of the recess between the first side surfaces increases in a downward direction, and
wherein a width of the recess between the second side surfaces decreases in the downward direction.

10. The semiconductor device of claim 7, wherein a thickness of a lowermost portion of the second epitaxial layer on the bottom surface is greater than a thickness of a lowermost portion of the first epitaxial layer.

11. The semiconductor device of claim 7, further comprising:
device isolation patterns provided on the substrate at opposite sides of the active pattern,
wherein the pair of sidewall spacers vertically overlap the device isolation patterns.

12. The semiconductor device of claim 7, wherein each of the first to third epitaxial layers contains germanium, and germanium concentrations of the second and third epitaxial layers are higher than that of the first epitaxial layer.

13. The semiconductor device claim 7, wherein the source/drain epitaxial layer further comprises a fourth epitaxial layer on the third epitaxial layer, and the fourth epitaxial layer comprises a silicon layer.

14. A semiconductor device, comprising:
a substrate provided with an elongated active pattern, the active pattern including a recess and first and second active fins including sidewalls defining at least portions of the recess;
an epitaxial source/drain region in the recess, the epitaxial source/drain region comprising a first epitaxial layer a bottom surface of the recess, a second epitaxial layer on the first epitaxial layer, and a third epitaxial layer on the second epitaxial layer; and
a gate electrode extending across the first active fin and along sidewalls of the first active fin,
wherein the first, second and third epitaxial layers each comprise a compound semiconductor material comprised of a first semiconductor element and a second semiconductor element and are each doped with a charge carrier impurity,
wherein the third epitaxial layer has a width in a second direction, the width increases gradually from a top portion of the second epitaxial layer to reach a maximum value between the top portion of the second epitaxial layer and a bottom surface of the third epitaxial layer, then decreases toward the bottom surface of the third epitaxial layer,
wherein a concentration of charge carrier impurity in the first epitaxial layer is lower than a concentration of the charge carrier impurity in the second epitaxial layer and lower than a concentration of the charge carrier impurity in the third epitaxial layer, and
wherein a concentration of charge carrier impurity in the second epitaxial layer is higher than a concentration of the charge carrier impurity in the third epitaxial layer.

15. The semiconductor device of claim 14, wherein the second epitaxial layer is thicker than the first epitaxial layer.

16. The semiconductor device of claim 7, wherein a top surface of each of the pair of the sidewall spacers is lower than a top surface of the active pattern under the gate electrode.

* * * * *